(12) United States Patent
Okawa (10) Patent No.: US 6,656,864 B2
(45) Date of Patent: Dec. 2, 2003

(54) DIELECTRIC CERAMICS AND DIELECTRIC RESONATOR

(75) Inventor: Yoshihiro Okawa, Kokubu (JP)

(73) Assignee: Kyocera Corporation, Kyoto (JP)

( * ) Notice: Subject to any disclaimer, the term of this patent is extended or adjusted under 35 U.S.C. 154(b) by 330 days.

(21) Appl. No.: 09/871,595

(22) Filed: May 30, 2001

(65) Prior Publication Data

US 2002/0045532 A1 Apr. 18, 2002

(30) Foreign Application Priority Data

May 30, 2000 (JP) ........................................ 2000-160568
Jun. 26, 2000 (JP) ........................................ 2000-191234
Sep. 18, 2000 (JP) ........................................ 2000-282287

(51) Int. Cl.⁷ ........................ C04B 35/465; C04B 35/47; C04B 35/478
(52) U.S. Cl. .................. 501/136; 333/219.1; 361/321.5
(58) Field of Search ........................ 501/136; 333/219.1; 361/321.5

(56) References Cited

U.S. PATENT DOCUMENTS 6,503,861 B1 * 1/2003 Murakawa et al. ......... 501/137

FOREIGN PATENT DOCUMENTS

| JP | 04-118807 | 4/1992 |
|----|-----------|--------|
| JP | 06-076633 | 3/1994 |
| JP | 11-106255 | 4/1999 |
| JP | 11-278927 | 10/1999 |

OTHER PUBLICATIONS

CAPLUS 1999:316928, Okawa et al, "Dielectric ceremic compositions with good . . . " May 1999.*

CAPLUS 2001:554766, Okawa et al, "Manufacture of dielectric ceramic compositions having . . . " Jul. 2001.*

CAPULAS 2002:503572, Okawa et al, "Dielectric ceremics and dielectic reasonators" Jul. 2002.*

* cited by examiner

Primary Examiner—David Brunsman
(74) Attorney, Agent, or Firm—Hogan & Hartson, LLP (57) ABSTRACT

The present inventions provides a dielectric ceramic comprising an oxide containing, as a metal element, at least a rare earth element (Ln), Al, M (M is Ca and/or Sr) and Ti, and at least part of the oxide of Al being present as a crystal phase of $\beta\text{-}Al_2O_3$ and/or $\theta\text{-}Al_2O_3$, thereby having a high $\epsilon r$, high Q value and a small temperature coefficient of resonance frequency in a high frequency region.

11 Claims, 5 Drawing Sheets

DIELECTRIC CERAMICS AND DIELECTRIC RESONATOR

FIELD OF THE INVENTION

The present invention relates to a dielectric ceramics having a high dielectric constant $\epsilon$ r and a high Q value of resonance acutance in a high frequency region such as of microwave and millimeter-wave, as well as a dielectric resonator. More particularly, the invention relates to a dielectric ceramics used for a variety of resonator materials, MIC (Monolithic IC) dielectric substrate materials, dielectric waveguide materials, multilayer ceramic capacitors and the like which are used, for example, in the mentioned high frequency region, as well as a dielectric resonator.

BACKGROUND OF THE INVENTION

Dielectric ceramics have been widely used for dielectric resonators, MIC dielectric substrates and waveguides in a high frequency region such as of microwave and millimeter-wave. The dielectric ceramics are generally required to have the following three principal properties:

1) A high dielectric constant to meet a demand for miniaturization, because the wavelength of propagating electromagnetic wave is reduced to $(1/\epsilon\ r)^{1/2}$ in a dielectric;
2) A small dielectric loss in the high frequency region, i.e., a high Q value; and
3) A small change of resonant frequency to temperature, i.e., a small and stable temperature dependency of dielectric constant $\epsilon$ r.

As such a dielectric ceramics, Japanese Patent Unexamined Publication No. 4-118807 (1992) discloses a dielectric ceramics composed of a $CaO\text{-}TiO_2\text{-}Nb_2O_5\text{-}XO$ system (wherein X is Zn, Mg, Co or Mn). However, this dielectric ceramics has the problem that a Q value by weight as 1 GHz is as low as about 1600 to 25000, and the temperature coefficient $\tau$ f of resonant frequency is as large as about 215 to 835 ppm/° C. It has therefore been desired to increase Q value and decrease $\tau$ f.

Upon this, the present applicant has proposed an LnAlCaTi dielectric ceramics (wherein Ln is a rare earth element) in Japanese Patent Unexamined Publication No. 6-76633 (1994), an LnAlSrCaTi dielectric ceramics (wherein Ln is a rare earth element) in Japanese Patent Unexamined Publication No. 11-278927 (1999), and an LnAlCaSrBaTi dielectric ceramics (wherein Ln is a rare earth element) in Japanese Patent Unexamined Publication No. 11-106255 (1999).

However, with the LnAlCaTi dielectric ceramics (Publication No. 6-76633), Q value is 20000 to 58000 when the dielectric constant $\epsilon$ r is in the range of 30 to 47, and Q value is less than 35000 in some instances.

With the LnAlSrCaTi dielectric ceramics (Publication No. 11-278927), Q value is 20000 to 75000 when the dielectric constant $\epsilon$ r is in the range of 30 to 48, and Q value is less than 35000 in some instances.

With the LnAlCaSrBaTi dielectric ceramics (Publication No. 11-106255), Q value is 30000 to 68000 when the dielectric constant $\epsilon$ r is in the range of 31 to 47, and Q value is less than 35000 in some instances.

Hence there has been a desire for a dielectric ceramics having more improvements in Q value.

SUMMARY OF THE INVENTION

It is a major object of the present invention to provide a dielectric ceramics having a Q value of not less than 35000 when dielectric constant $\epsilon$ r is in the range of 30 to 48, as well as a dielectric resonator.

It is another object of the present invention to provide a dielectric ceramics having a Q value of not less than 40000 when dielectric constant $\epsilon$ r is not less than 40, as well as a dielectric resonator.

It is still another object of the present invention to provide a dielectric ceramics having a small and stable temperature dependency of dielectric constant $\epsilon$ r, as well as a dielectric resonator.

A dielectric ceramics of the present invention in order to achieve the above objects is composed of an oxide containing, as a metal element, at least a rare earth element (Ln), Al, M (M is Ca and/or Sr) and Ti, at least part of the oxide of Al being present as a crystal phase of $\beta\text{-}Al_2O_3$ and/or $\theta\text{-}Al_2O_3$.

Of the crystals composed of the oxide containing a rare earth element (Ln), Al, M (M is Ca and/or Sr) and Ti, the crystal of which crystal system is hexagonal and/or orthorhombic is preferably present not less than 80% by volume.

A dielectric ceramics of the present invention preferably contains, as a metal element, at least one of Mn, W and Ta in an amount of 0.01 to 3% by weight as $MnO_2$, $WO_3$ and $Ta_2O_5$, respectively.

The crystal phase of $\beta\text{-}Al_2O_3$ and/or $\theta\text{-}Al_2O_3$ is preferably contained in a rate of 1/100000 to 3% by volume.

A dielectric ceramics of the present invention contains, as a metal element, at least a rare earth element (Ln), Al, M (M is Ca and/or Sr) and Ti, and when its composition formula being expressed as follows:

$$aLn_2O,\ bAl_2O_3\ cMO\ dTiO_2\ (\text{where } 3 \leq x \leq 4),$$

a, b, c and d preferably satisfy the followings:

$0.056 \leq a \leq 0.214$ $0.056 \leq b \leq 0.214$ $0.286 \leq c \leq 0.500$ $0.230 \leq d \leq 0.470$ $a+b+c+d=1$ The present invention also provides a dielectric ceramics containing, as a metal element, at least a rare earth element (Ln), Al, M (M is Ca and/or Sr) and Ti, characterized in that an average particle diameter $D_1$ of the crystal of which main phase is a crystal phase composed of an oxide of M and Ti is larger than an average particle diameter $D_2$ of the crystal of which main phase is a crystal phase composed of an oxide of a rare earth element (Ln) and Al.

Like the foregoing dielectric ceramics, this dielectric ceramics also has a large dielectric constant $\epsilon$ r, a high Q value, and a small temperature dependency of dielectric constant $\epsilon$ r.

The average particle diameter $D_1$ of the crystal of which main phase is a crystal phase composed of an oxide of M and Ti is $12\ \mu m \leq D_1 \leq 100\ \mu m$, preferably $15\ \mu m \leq D_1 \leq 60\ \mu m$, and the average particle diameter $D_2$ of the crystal of which main phase is a crystal phase composed of an oxide of a rare earth element (Ln) and Al is $3\ \mu m \leq D_2 \leq 12\ \mu m$, preferably $5\ \mu m \leq D_2 \leq 10\ \mu m$. Further, it is preferable that this dielectric ceramics has the same composition formula as described above, and the mole ratios a, b, c and d have the same range as described above.

A dielectric resonator of the present invention is one in which the above-mentioned dielectric ceramics is disposed between a pair of input/output terminals so as to be operated by electromagnetic coupling.

These and other objects and advantages of the present invention will become more apparent from the following detailed description.

DETAILED DESCRIPTION OF THE INVENTION

The term "dielectric ceramics" in the present invention means a sintered body obtained by molding and firing a non-sintered body. In order to increase Q value, it is important that a dielectric ceramics is composed of an oxide containing, as a metal element, at least a rare earth element (Ln), Al, M (M is Ca and/or Sr) and Ti, and at least part of the oxide of Al is present as a crystal phase of $\beta$-Al$_2$O$_3$ and/or $\theta$-Al$_2$O$_3$.

It is particularly preferable that the main crystal phase of a dielectric ceramics of the invention is a perovskite-type crystal composed of a solid solution of LnAlO(x+$_3$)/2 ($3 \leq x \leq 4$) and MTiO$_3$, and $\beta$-Al$_2$O$_3$ and/or $\theta$-Al$_2$O$_3$ is present as other crystal phase.

Thus, a dielectric ceramics of the invention contains $\beta$-Al$_2$O$_3$ and/or $\theta$-Al$_2$O$_3$, thereby enabling to obtain dielectric characteristic especially excellent as a dielectric ceramics for resonator. That is, the reason why the present invention can increase Q value can be considered that the oxygen defect in the sintered body is reduced by the presence of $\beta$-Al$_2$O$_3$ and/or $\theta$-Al$_2$O in the dielectric ceramics.

It is important that a dielectric ceramics contains a 1/100000 to 3% by volume of a crystal phase of $\beta$-Al$_2$O$_3$ and/or $\theta$-Al$_2$O$_3$, thereby remarkably increasing Q value. In order to further increase Q value, a dielectric ceramics preferably contains a 1/20000 to 2% by volume of a crystal phase of $\beta$-Al$_2$O$_3$ and/or $\theta$-Al$_2$O$_3$, and it is particularly preferable to contain in the range of 1/5000 to 0.5% by volume.

In order to considerably increase Q value, the average crystal particle diameter of $\beta$-Al$_2$O$_3$ and $\theta$-Al$_2$O$_3$ is preferably 0.1 to 40 $\mu$m. It is particularly preferable that the average crystal particle diameter of $\beta$-Al$_2$O$_3$ is 0.1 to 6 $\mu$m, and the average crystal particle diameter of $\theta$—Al$_2$O$_3$ is 3 to 40 $\mu$m. In order to increase Q value, the average aspect ratio of the crystal of $\beta$-Al$_2$O$_3$ is preferably 2 to 30.

It is also important that in the crystals composed of the oxide containing a rare earth element (Ln), Al, M (M is Ca and/or Sr) and Ti, the crystal of which crystal system is hexagonal and/or orthorhombic is present not less than 80% by volume, thereby further increasing Q value. In order to increase Q value, it is more desirable that the crystal of which crystal system is hexagonal and/or orthorhombic is present not less than 90% by volume. In the present invention, the reason why a 80% by volume or more of the crystal of which crystal system is hexagonal and/or orthorhombic enables to increase Q value can be considered that since hexagonal and orthorhombic are of a crystal system having a relatively high symmetry, a large amount of a crystal system of hexagonal and/or orthorhombic contributes to improvements in Q value.

The expression "in the crystals composed of the oxide containing a rare earth element (Ln), Al, M (M is Ca and/or Sr) and Ti, the crystal of which crystal system is hexagonal and/or orthorhombic" means that this crystal satisfies both of the crystal systems of hexagonal and orthorhombic. For example, this crystal satisfies the crystal structures of a hexagonal LaAlO$_3$ and an orthorhombic CaTiO$_3$ at the same time.

According to the invention, a dielectric ceramics contains, as a metal element, at least one selected from Mn, W and Ta in an amount of 0.01 to 3% by weight in total, as MnO$_2$, WO$_3$ and Ta$_2$O$_5$, respectively. This permits a noticeable improvement in Q value. In order to further increase Q value, it is more preferable to contain at least one selected from Mn, W and Ta in an amount of 0.02 to 2% by weight in total, as MnO$_2$, WO$_3$ and Ta$_2$O$_5$, respectively. It is particularly preferable to contain Mn in an amount of 0.02 to 0.5% by weight as MnO$_2$.

It is also important that a dielectric ceramics of the present invention contains, as a metal element, at least a rare earth element (Ln), Al, M (M is Ca and/or Sr) and Ti, and when its composition formula is expressed as follows:

aLn$_2$O$_x$ bAl$_2$O$_3$ cMO dTiO$_2$ (where $3 \leq x \leq 4$), a, b, c and d satisfy the followings:

$0.056 \leq a \leq 0.214$ $0.056 \leq b \leq 0.214$ $0.286 \leq c \leq 0.500$ $0.230 < d < 0.470$ a+b+c+d=1

The reason why the mole ratios a, b, c and d of their respective components are limited to the above-mentioned ranges in the present invention is as follows.

As to the condition of $0.056 \leq a \leq 0.214$, when the mole ratio a is in this range, $\epsilon$ r is large, Q value is high, and the temperature coefficient z f of resonant frequency becomes small. The range of $0.078 \leq a \leq 0.214$ is particularly preferable.

As to the condition of $056 \leq b \leq 0.214$, when the mole ratio b is in this range, $\epsilon$ r is large, Q value is high, and the absolute value of $\tau$ f becomes small. The range of $0.078 \leq b \leq 0.214$ is particularly preferable.

As to the condition of $0.286 \leq c \leq 0.500$, when the mole ratio c is in this range, $\epsilon$ r is large, Q value is high, and the absolute value of $\tau$ f becomes small. The range of $0.330 \leq c \leq 0.470$ is particularly preferable.

As to the condition of $0.230 < d < 0.470$, when the mole ratio d is in this range, $\epsilon$ r is large, Q value is high, and the absolute value of $\tau$ f becomes small. The range of $0.340 \leq d \leq 0.45$ is particularly preferable.

In order to increase Q value, the mole ratios a, b, c and d preferably have the following relationship: $0.75 \leq (b+d)/(a+c) \leq 1.25$, particularly $0.85 \leq (b+d)/(a+c) \leq 1.15$.

In the meantime, the presence of the crystal composed of $\beta$-Al$_2$O$_3$ and/or $\theta$-Al$_2$O$_3$ contained in the dielectric ceramics of the invention, and the identification of the crystal system of each crystal are carried out by, for example, observation with a transmission electron microscope, analysis with a selected area electron diffraction image and measurement by energy dispersive X-ray spectroscopic analysis (EDS analysis) or measurement by micro X-ray diffraction method. In the case of measuring the presence of the crystal composed of β-$Al_2O_3$ and/or θ-$Al_2O_3$ contained in the dielectric ceramics of the invention, and the percent by volume of the crystal of which crystal system is hexagonal and/or orthorhombic, observation with a transmission electron microscope, analysis with a selected area electron diffraction image and measurement by energy dispersive X-ray spectroscopic analysis (EDS analysis) are preferable.

In the case of confirming the presence of the crystal composed of β$Al_2O_3$ and/or θ-$Al_2O_3$ contained in the dielectric ceramics of the invention, and conducting the identification of the crystal system of each crystal by means of observation with a transmission electron microscope, analysis with a selected area electron diffraction image and EDS analysis, these are, for example, carried out in the following steps (A) to (G).

(A) The crystals of plural positions selected from the inside of a dielectric ceramics with random sampling are observed with respect to an area of about $5 \times 10^{-3}$ to $5 \times 10^{-2}$ mm² by photography and selected area electron diffraction image at a magnification of about 1000 to 10000 times, and the electron diffraction image of each crystal is analyzed to identify its crystal structure;

(B) When the crystal structure of the crystal identified in (A) is β-$Al_2O_3$ and/or θ-$Al_2O_3$, this crystal is to be β-$Al_2O_3$ and/or θ-$Al_2O_3$ contained in a dielectric ceramics of the invention;

(C) There is found the proportions of the crystals corresponding to the β-$Al_2O_3$ and/or θ-$Al_2O_3$ identified in (B), to the entire area of the crystal photograph observed in (A), and this proportions are to be the percent by volume of β-$Al_2O_3$ and/or θ-$Al_2O_3$, respectively;

(D) The average crystal particle diameter Hd of β-$Al_2O_3$ and/or θ-$Al_2O_3$ identified in (B) is found from the following equation: $Hd = 2(A/\pi)^{1/2}$ wherein A is a value obtained by diving the area of the crystal corresponding to β-$Al_2O_3$ and/or θ-$Al_2O_3$ in (C) by the number of the crystals of β-$Al_2O_3$ and/or θ-$Al_2O_3$;

(E) The aspect ratio of the crystal of β-$Al_2O_3$ is found from the crystal photograph;

(F) Further, each crystal identified in (A) is subjected to EDS analysis, so that it is confirmed whether the crystals being β-$Al_2O_3$ and/or θ-$Al_2O_3$ have a relatively more Al and/or a relatively less Ti, as compared to other crystals.

(G) There is found the percent by volume of the crystals among the crystals identified in (A), which are composed of an oxide containing a rare earth element (Ln), Al, M (M is Ca and/or Sr) and Ti, and have the crystal structure of hexagonal and/or orthorhombic. The percent by area of the crystals composed of an oxide containing a rare earth element (Ln), Al, M (M is Ca and/or Sr) and Ti, in the area of the photograph where the ceramics is present is converted to a percent by volume.

As a measuring device, for example, a transmission electron microscopea JEM2010F of JEOL Corp. and an EDS analyzer VoyagerIV of Noran Instruments Corp. are usable. Note that the measurements of the above (A) to (F) are directed to the interior of the sintered body, and that the crystal composed of β-$Al_2O_3$ and/or θ-$Al_2O_3$ is not be defined as a crystal composed of hexagonal and/or orthorhombic contained in a dielectric ceramics of the invention.

The crystal of hexagonal and/or orthorhombic contained in a dielectric ceramics of the invention is identified at least one or more of, for example, hexagonal LaAl $O_3$ and AlNdO$_3$, and an orthorhombic $CaTiO_3$. In such a case that the crystal composed of hexagonal and/or orthorhombic crystal system contained in a dielectric ceramics of the invention is at the same time identified by the crystal structure composed of a cubic crystal system, its crystal system is to be defined as hexagonal and/or orthorhombic. For instance, a crystal of which crystal system is identified by a cubic $SrTiO_3$ and/or $LaTiO_3$, and also by hexagonal and/or orthorhombic, is to be a crystal composed of a crystal system of hexagonal and/or orthorhombic.

Of the crystals composed of an oxide containing a rare earth element (Ln), Al, M (M is Ca and/or Sr) and Ti, the crystal composed of a crystal system other than hexagonal and/or orthorhombic is regarded that its crystal structure is unclear, or it is for example identified by at least one or more of crystal structures such as of tetragonal $SrLaAlO_3$, $Sr_4Ti_3O_{10}$, $Sr_2TiO_4$, $Sr_3Al_2O_7$, $SrLa_2Ti_{14}O_{12}$, and monoclinic $SrAl_2O_4$, $Nd_2Ti_2O_7$, and $SrAl_4O_7$.

β-$Al_2O_3$ and/or θ-$Al_2O_3$ contained in a dielectric ceramics of the invention is, for exmaple, composed of at least one of $La_2O_3 \cdot 11Al_2O_3$, $Nd_2O_3 \cdot 11Al_2O_3$, $CaO \cdot 6Al_2O_3$, and $SrO \cdot 6Al_2O_3$. The crystal structure of β-$Al_2O_3$ contained in a dielectric ceramics of the invention is, for example, composed of β-$Al_2O_3$ of No. 10-0414 of JCPDS-ICDD, and the crystal structure of θ-$Al_2O_3$ is, for example, composed of θ-$Al_2O_3$ of No. 11-0517 of JCPDS-ICDD. The β-$Al_2O_3$ contained in a dielectric ceramics of the invention may be β'-$Al_2O_3$ and/or β''-$Al_2O_3$.

It is desirable that a rare earth element (Ln) contained in a dielectric ceramics of the invention is at least one selected from oxides of Y, La, Ce, Pr, Nd, Sm, Eu, Gd, Tb, Dy, Ho, Er and Yb. In order to increase Q value, it is preferable that the rare earth element is at least one selected from La, Nd, Sm, Eu, Gd and Dy, particularly at least one selected from La, Nd and Sm. In order to increase Q value in the invention, the most preferred rare earth element is La.

A dielectric ceramics of the invention is prepared by the following steps of firing a molding body containing, as a metal element, at least a rare earth element (Ln), Al, M (M is Ca and/or Sr) and Ti at 1630 to 1680° C. for 5 to 10 hours; lowering the temperature from 1630-1680° C. to 1300° C. at 310 to 500° C./hour, and lowering the temperature from 1300° C. to 1100° C. at 5 to 100° C./hour; and then holding 20 hours or more at 1100 to 1050° C. The use of this method enables to generate β-$Al_2O_3$ and/or θ-$Al_2O_3$ and increase Q value. In addition, the mentioned preparation method can be arranged such that in the crystals composed of the oxide containing a rare earth element (Ln), Al, M (M is Ca and/or Sr) and Ti, the crystal of which crystal system is hexagonal and/or orthorhombic is present not less than 80% by volume, thereby increasing Q value.

In order to further increase Q value, it is preferable, after holding at 1100 to 1050° C. for 20 hours or more, to hold at 1050 to 1000° C. for 20 hours or more. It is more preferable, after holding at 1630 to 1680° C. for 6 to 9 hours, to lower the temperature from 1630-1680° C. to 1300° C. at 350 to 450° C./hour, lower the temperature from 1300° C. to 1100° C. at 8 to 40° C./hour, and then hold at 1100 to 1050° C. for 30 hours or more, followed by firing. A preparation method of a dielectric ceramics of the invention preferably includes the step of calcination, before molding the material into a predetermined shape, the material at 1320 to 1350° C. for 1 to 10 hours. With a calcination at a temperature lower than 1320° C. or higher than 1350° C., β-$Al_2O_3$ and/or θ-$Al_2O_3$ might not sufficiently be generated in the step of firing. This results in unsatisfactorily effect of increasing Q value.

Under the mentioned calcination condition, β-Al₂O₃ and/ or θ-Al₂O₃ are sufficiently generated, thereby leading to noticeable improvements in Q value.

In a method of preparing a dielectric ceramics of the invention, a dielectric ceramics of higher Q value can be obtained by using, as the starting material of a dielectric ceramics, a material further containing, as a metal element, at least one selected from Mn, W and Ta in an amount of 0.01 to 3% by weight of in total, as $MnO_2$, $WO_3$ and $Ta_2O_5$, respectively.

The reason why the preparation method of the invention can increase Q value can be considered that β-Al₂O₃ and/or θ-Al₂O₃ is generated and the oxygen defect in the sintered body is decreased because the sintering step, particularly the step of holding at high temperatures and the following step of temperature lowering are carried out according to the mentioned preparation method. It also seems that the oxygen defect is further decreased by containing at least one of Mn, W and Ta in an amount of 0.01 to 3% by weight as $MnO_2$, $WO_3$ and $Ta_2O_5$, respectively, thus leading to further higher Q value.

An example of preferred preparation methods of a dielectric ceramics of the invention comprises, for example, the following steps (1a) to (5a).

(1a) As a starting material, there are used each powder of a rare earth oxide, aluminum oxide, calcium carbonate, strontium carbonate and titanium oxide, which are all of high purity. These are weighed out so as to be a desired proportion and then mixed. To this mixture, pure water is added and subjected to wet blending and grinding by a ball mill using zirconia balls etc. for 1 to 100 hours until the average particle diameter of the mixed material becomes not more than 2.0 μm, preferably 0.6 to 1.4 μm.

(2a) The obtained mixture is dried and calcinated at 1320 to 1350° C. for 1 to 10 hours, to obtain a calcination.

(3a) The resulting calcination is mixed with at lease one of a predetermined amount of manganese carbonate ($MnCO_3$), tungsten oxide ($WO_3$) and tantalum oxide ($Ta_2O_5$). Pure water is added thereto, and this is subjected to wet blending and grinding by a ball mill using zirconia balls etc. for 1 to 100 hours until its average particle diameter becomes not more than 2.0 μm, preferably 0.6 to 1.4 μm.

(4a) Further, a 3 to 10% by weight of a binder is added and dehydrated, followed by granulating or particle sizing by a known method, e.g., spray drying method. The resulting granulated body or particle-sized body is molded into a desired shape by a known molding method, e.g., mold pressing method, cold iostatic pressing method, or extrusion molding method. The shape of the granulated body or particle-sized body is not limited to solid such as fine particles, but may be solid such as a slurry or liquid mixture. In this case, the liquid may be liquids other than water, e.g., IPA (isopropyl alcohol), methanol, ethanol, toluene, or acetone.

(5a) The obtained molded body is held at 1630 to 1680° C. for 5 to 10 hours, the temperature from 1630 to 1680° C. is lowered to 1300° C. at 310 to 500° C./hour, the temperature of 1300° C. is lowered to 1100° C. at 5 to 100° C./hour, then held at 1100 to 1050° C. for 20 hours or more and then calcinated to obtain a dielectric ceramics of the invention. The dielectric ceramics of the invention may be prepared by further holding at 1050 to 1000° C. for 20 hours or more.

In a preparation method of a dielectric ceramics of the invention, the reason for holding at 1630 to 1680° C. for 5 to 10 hours is that Q value lowers by holding at a temperature higher than 1680° C. The reason for lowering the temperature from 1630-1680° C. to 1300° C. at 310 to 500° C./hour is that Q value lowers at a temperature lowering rate less than 310° C./hour or larger than 500° C./hour. The reason for further lowering the temperature from 1300° C. to 1100° C. at 5 to 100° C./hour is that Q value lowers at a decreasing rate less than 5° C./hour or larger than 100° C./hour. The reason for further holding at 1100 to 1050° C. for 20 hours or more is that Q value lowers by holding for less than 20 hours. Also, the reason for holding at 1050 to 1000° C. for 20 hours or more in order to increase Q value is that Q value lowers by holding for less than 20 hours. The reason for calcination at 1320 to 1350° C. is for the purpose of increasing Q value.

To a dielectric ceramics of the invention, there may be added ZnO, NiO, $SnO_2$, $Co_3O_4$, $ZrO_2$, $LiCO_3$, $Rb_2CO_3$, $Sc_2O_3$, $V_2O_5$, CuO, $SiO_2$, $BaCO_3$, $MgCO_3$, $Cr_2O_3$, $B_2O_3$, $GeO_2$, $Sb_2O_5$, $Nb_2O_5$, $Ga_2O_3$, $Fe_2O_3$ or the like. Depending on the kind of the added component, these can be added in such a proportion that the total amount is not more than 5 parts by weight to 100 parts by weight of a main component, in order to optimize the value of ε r and the temperature coefficient τ f of resonant frequency.

In a dielectric ceramics according to other preferred embodiment of the invention, an average particle diameter $D_1$ of the crystal of which main phase is a crystal phase composed of an oxide of M (M is Ca and/or Sr) and Ti is larger than an average particle diameter $D_2$ of the crystal of which main phase is a crystal phase composed of an oxide of a rare earth element (Ln) and Al.

Specifically, the average particle diameter $D_1$ of one crystal is 12 μm $\leq D_1 \leq$ 100 μm as described above, and the average particle diameter $D_2$ of the other crystal is 3 μm $\leq D_2 \leq$ 12 μm. More preferably, the average particle diameter $D_1$ of one crystal is 15 μm $\leq D_1 \leq$ =60 μm, and the average particle diameter $D_2$ of the other crystal is 5 μm $\leq D_2 \leq$ 10 μm.

In the meantime, the measurement of crystal particle diameter, the identification of the crystal of which main phase is a crystal phase composed of an oxide of M (M is Ca and/or Sr) and Ti, and the identification of the crystal of which main phase is a crystal phase composed of an oxide of a rare earth element (Ln) and Al, are carried out by the following steps (i) to (iv).

(i) From the interior of a sintered body, more than four areas are selected at random to take samples. The sections of these samples are subjected to surface grinding and mirror finish. A heat treatment of the mirror-finished samples is conducted, for example, at 1450° C. for 15 minutes by using thermal etching method, so that the crystal shape can be observed by a SEM image. Generally, it is suitable that the heat treatment temperature is 1200 to 1550° C. and the holding time is in the range of about 1 minute to 2 hours. It is important to manage so that the crystal shape can be observed by SEM and the grain boundary can be observed clearly.

After heat treatment, with respect to each of the samples, the crystal diameter of about 20 to 100 pieces are measured under the following conditions. Firstly, using a wavelength dispersive X-ray micro-analyzer, photographs of reflection electron images are taken at 15 kV in accelerating voltage, about 5×10⁻¹⁰ A in probe current, and about 300 to 3000 times in magnification. The average crystal particle diameter of each of the photographs thus obtained is measured. The particle diameter is measured by image analysis method. With this method, the average crystal particle diameter Hd is found as follows.

$$Hd = 2(A/\pi)^{1/2}$$

wherein A is the area within a particle, and calculated from the equation: (the entire area of a crystal)/(the number of crystals).

(ii) With respect to the crystals of which average crystal particle diameter was measured in the above (i), under the conditions of 15 kV in accelerating voltage and about $1.0 \times 10^{-8}$ A to $1.0 \times 10^{-7}$ A in probe current, the intensity of characteristic X-ray of each of the elements of a rare earth element (Ln), Al, M (M is Ca and/or Sr) and Ti, is found and their respective average values of the intensity of the characteristic X-ray, $I_{Ln}$, $I_{Al}$, $I_M$, and $I_{Ti}$, are found. $I_M$ is to be the sum of the average value of the characteristic X-ray intensity of Ca and the average value of the characteristic X-ray intensity of Sr. When plural rare earth elements are contained, $I_{Ln}$ is to be the sum of the average values of the intensities of the contained rare earth elements. In this case, in order that the crystals having a particle diameter of about 5 μm or less is less subjected to the influence of crystals other than the crystal to be measured, it is necessary to pay attention to the setting of prove current and the like.

(iii) The intensity of each element in each crystal is compared to $I_{Ln}$, $I_{Al}$, $I_M$, and $I_{Ti}$. The crystal in which the intensities of a rare earth element (Ln) and Al are larger than $I_M$ and $I_{Al}$ is to be defined as a crystal of which main phase is a crystal phase composed of an oxide of a rare earth element (Ln) and Al. The crystal in which the intensities of M (M is Ca and/or Sr) and Ti are larger than $I_M$ and $I_{Ti}$ is to be defined as a crystal of which main phase is a crystal phase composed of an oxide of M (M is Ca and/or Sr) and Ti. Note that the crystal in which all the intensities of a rare earth element (Ln), Al, M and Ti are larger than $I_{Ln}$, $I_{Al}$, $I_M$, and $I_{Ti}$ is to be defined as neither a crystal of which main phase is a crystal phase composed of an oxide of a rare earth element (Ln) and Al, nor a crystal of which main phase is a crystal phase composed of an oxide of M and Ti.

(iv) By using a method other than the above-mentioned, for example, a transmission electron microscope (TEM), X-ray diffraction method and the like, there may be measured and identified as to whether each crystal particle takes, as its main phase, a crystal phase composed of an oxide of M (M is Ca and/or Sr) and Ti, or a crystal phase composed of an oxide of a rare earth element (Ln) and Al. For instance, by using TEM, X-ray diffraction micrography and X-ray diffraction method, such measurement and identification are carried out as follows.

In the case of identifying a crystal phase by TEM, with a transmission electron microscope JEM2010F of JEOL Corp. and an EDS analyzer VoyagerIV of Noran Instruments Corp. for example, an EDS point analysis is conducted for more than 20 crystal particles selected at random. By "thin-film approximation method", the element proportions of M (M is Ca and/or Sr), Ti, rare earth element (Ln), Al and oxygen in each of the crystals are obtained by semiquantitative calculation. The result is then converted to the ratio excluding oxygen, thereby obtaining the elemental ratios of M, Ti, rare earth element (Ln) and Al. The average value of the elemental ratios of each crystal is calculated per element. Based on this average value, the crystal having large elemental ratios of M (M is Ca and/or Sr) and Ti is taken as a crystal of which main phase is a crystal phase composed of an oxide of M and Ti, and the crystal having large elemental ratios of a rare earth element (Ln) and Al is taken as a crystal of which main phase is a crystal phase composed of an oxide of a rare earth element (Ln) and Al.

The average value of the particle diameters of the crystal of which main phase is a crystal phase composed of an oxide of M (M is Ca and/or Sr) and Ti, is compared to the average value of the particle diameters of the crystals of which main phase is a crystal phase composed of an oxide of a rare earth element (Ln) and Al. In this case, the average crystal particle diameter Hd is found from the above-mentioned equation: Hd=$2(A/\pi)^{1/2}$, wherein A is the area within a particle.

The identification of a crystal phase by X-ray diffraction method is conducted as follows. It is determined as to whether a peak interplanar spacing d of the X-ray diffraction of each crystal is closer to either of (i) one plane of a crystal phase composed of an oxide of M (M is Ca and/or Sr) and Ti, for example, an interplanar spacing d1 corresponding to a (110)-oriented plane, and (ii) one plane of a crystal phase composed of an oxide of a rare earth element (Ln) and Al, for example, an interplanar spacing d2 corresponding to a (110)-oriented plane. The crystal phase determined as being closer is defined as a main crystal phase. That is, in the case of d1>d2, if d>(d1+d2)/2, it is taken as a crystal of which main phase is a crystal phase composed of an oxide of M (M is Ca and/or Sr) and Ti. If d<(d1+d2)/2, it is taken as a crystal of which main phase is a crystal phase composed of an oxide of a rare earth element (Ln) and Al.

On the other hand, in the case of d1<d2, if d<(d1+d2)/2, it is taken as a crystal of which main phase is a crystal phase composed of an oxide of M (M is Ca and/or Sr) and Ti. If d>(d1+d2)/2, it is taken as a crystal of which main phase is a crystal phase composed of an oxide of a rare earth element (Ln) and Al.

The interplanar spacing d1 of the crystal of the oxide of M (M is Ca and/or Sr) and Ti, and the interplanar spacing d2 of the crystal of the oxide of the rare earth element (Ln) and Al, are measured on a plane having the same Miller indices.

When this measurement is made by using X-ray diffraction micrography or X-ray diffraction method, it is desirable that the diameter of X-ray point source is smaller than the crystal particle.

There may be used any measuring method which can compare a rate of an element present in each crystal by using a manner other than the above mentioned (A) to (D).

In order to prepare a dielectric ceramics of the invention in which the average particle diameter $D_1$ of the crystal of which main phase is a crystal phase composed of an oxide of M and Ti is larger than the average particle diameter $D_2$ of the crystal of which main phase is a crystal phase composed of an oxide of a rare earth element (Ln) and Al, a starting material of the dielectric ceramic composition is molded into a predetermined shape, thereafter, the temperature from 1000 to 1400° C. is elevated at an average temperature elevating rate of 5 to 100° C./hour, and the temperature of not less than 1400° C. is elevated at an average temperature elevating rate of 310 to 500° C./hour, followed by firing at 1500 to 1700° C. for at least 15 hours or more.

This two-stage firing step enables that the average particle diameter of the crystal of which main phase is a crystal phase composed of an oxide of M and Ti is larger than the average particle diameter of the crystal of which main phase is a crystal phase composed of an oxide of a rare earth element (Ln) and Al, thereby increasing Q value. Preferably, the temperature from 1000 to 1400° C. is elevated at an average temperature elevating rate of 25 to 75° C./hour, and the temperature of not less than 1400° C. is elevated at an average temperature elevating rate of 350 to 450° C./hour, followed by firing at 1550 to 1680° C. for at least 15 hours or more. This permits to further increase Q value.

The expression "firing at 1500 to 1700° C., preferably 1550 to 1680° C., for at least 15 hours or more 1500" means that the temperature is elevated, or held, or lowered at temperatures in this range, and the temperature elevation, holding or lowering may be repeated in this range.

The reason why the average particle diameter of the crystal of which main phase is a crystal phase composed of an oxide of M and Ti is larger than the average particle diameter of the crystal of which main phase is a crystal phase composed of an oxide of a rare earth element (Ln) and Al, can be considered as follows. Because of the sintering step, particularly the elevated temperature and the following holding at high temperature, the crystal phase of which main phase is the crystal phase composed of the oxide of M (M is Ca and/or Sr) and Ti grows in grain. Especially, the crystal phase composed of the oxide of M (M is Ca and/or Sr) and Ti is sintered while growing in grain, by elevating the temperature from 1000° C. to 1400° C. at a relatively small temperature elevating rate, that is, the average temperature elevating rate of 5 to 100° C./hour. Successively, by elevating the temperature of not less than 1400° C. at a relatively large temperature elevating rate, that is, the average temperature elevating rate of 310 to 500° C./hour, the sintering of the crystal phase composed of the oxide of a rare earth element (Ln) and Al is also proceeded. However, it can be considered that by firing at high temperatures of 1500° C. to 1700° C. for 15 hours or more, the crystal phase composed of the oxide of M (M is Ca and/or Sr) and Ti further grows in grain, whereas the crystal phase composed of the oxide of a rare earth element (Ln) and Al is hard to grow in grain even in the firing step at high temperatures of not less than 1500° C.

The reason why a dielectric ceramics of the invention prepared in the foregoing method has a high Q value can be considered as follows.

In general, it can be considered that the grain boundary of crystals of a sintered body is responsible for dielectric loss in a high frequency band, therefore, as the crystal particle diameter is increased, the dielectric loss due to grain boundary is decreased and Q value is higher. When a plurality of main crystal phases are present in a sintered body, it can be considered that Q value of the sintered body is considerably governed by the crystal phase having a low Q value.

In the present invention, there are present the crystal of which main phase is the crystal phase composed of the oxide of a rare earth element (Ln) and Al, and the crystal of which main phase is the crystal phase composed of the oxide of M (M is Ca and/or Sr) and Ti. It can be considered that the main phase of the former is $LnAlO_{(X+3)/2}$ ($3 \leq x \leq 4$), and that of the latter is $MTiO_3$ (M is Ca and/or Sr). When Q values of these two crystal phases are converted to 1 GHz, several tens of thousands is obtained for $LnAlO_{(X+3)/2}$ ($3 \leq x \leq 4$), and several thousands is obtained for $MTiO_3$. That is, $MTiO_3$ has a lower Q value. Therefore, it can be considered that in the present invention, Q value of the sintered body can be increased by increasing the particle diameter of the crystal taking $MTiO_3$ having a low Q value, as its main crystal phase.

Specifically, a preparation method of the invention comprises the following steps (1a) to (7a).

(1a) As a starting material, there are used each powder of a high purity rare earth oxide and a high purity aluminum oxide. After these are weighed out so as to be a desired proportion, pure water is added thereto, and this is subjected to wet blending and grinding by a ball mill using zirconia balls etc. for 1 to 100 hours until the average particle diameter of the mixed material becomes not more than 2.0 μm.

(2a) The mixture is dried and calcinated at 1000 to 1300° C. for 1 to 10 hours, to obtain a calcination of which main crystal phase is $LnAlO_{(X+3)/2}$ ($3 \leq x \leq 4$).

(3a) Separately, there are used each powder of calcium carbonate and/or strontium carbonate, and titanium oxide. After these are weighed out so as to be a desired proportion, pure water is added thereto, and this is subjected to wet blending and grinding by a ball mill using zirconia balls etc. for 1 to 100 hours until the average particle diameter of the mixed material becomes not more than 2.0 μm, preferably 0.6 to 1.4 μm.

(4a) This mixture is dried and calcinated at 1000 to 1300° C. for 1 to 10 hours, to obtain a calcination of which main crystal phase is $MTiO_3$ (M is Ca and/or Sr).

(5a) The obtained calcination of which main crystal phase is $LnAlO_{(X+3)/2}$ ($3 \leq x \leq 4$) and the calcination of which main crystal phase is $MTiO_3$ (M is Ca and/or Sr) are mixed in a predetermined proportion. The mixed material is then subjected to wet blending and grinding by a ball mill using zirconia balls etc. for 1 to 100 hours until the average particle diameter of the mixed material becomes not more than 2.0 μm, preferably 0.6 to 1.4 μm.

(6a) Further, a 3 to 10% by weight of a binder is added and dehydrated, followed by granulating or particle sizing by a known method, e.g., spray drying method. The resulting granulated body or particle-sized body is molded into a desired shape by a known molding method, e.g., mold pressing method, cold isostatic pressing method, or extrusion molding. The shape of the granulated body or particle-sized body is not limited to solid such as pulverulent body, but may be solid such as a slurry or liquid mixture. In this case, the liquid may be liquids other than water, e.g., IPA (isopropyl alcohol), methanol, ethanol, toluene, or acetone.

(7a) The temperature from 1000° C. to 1400° C. of the obtained molded body is elevated at a temperature elevating rate of 5 to 100° C./hour, and the temperature of not less than 1400° C. is elevated at a temperature elevating rate of 310 to 500° C./hour, followed by firing at 1500 to 1700° C. for at least 15 hours or more. This results in a dielectric ceramics of the invention.

If from 1000° C. to 1400° C., the temperature elevating rate is below 5° C./hour or above 100° C./hour, Q value might drop. If from not less than 1400° C., the temperature elevating rate is below 310° C./hour or above 500° C./hour, Q value might drop. With firing at 1500 to 1700° C. for less than 15 hours, Q value might drop.

Also in this dielectric ceramics, to the above component as a main component, there may be added $ZnO$, $NiO$, $SnO_2$, $Co_3O_4$, $MnCO_3$, $ZrO_2$, $WO_3$, $LiCO_3$, $Rb_2CO_3$, $Sc_2O_3$, $V_2O_5$, $CuO$, $SiO_2$, $BaCO_3$, $MgCO_3$, $Cr_2O_3$, $B_2O_3$, $GeO_2$, $Sb_2O_5$, $Nb_2O_5$, $Ta_2O_5$, $Ga_2O_3$, or the like. Depending on the kind of the added component, these can be added in a proportion of not more than 6 parts by weight to 100 parts by weight of the main component.

Figure 1:
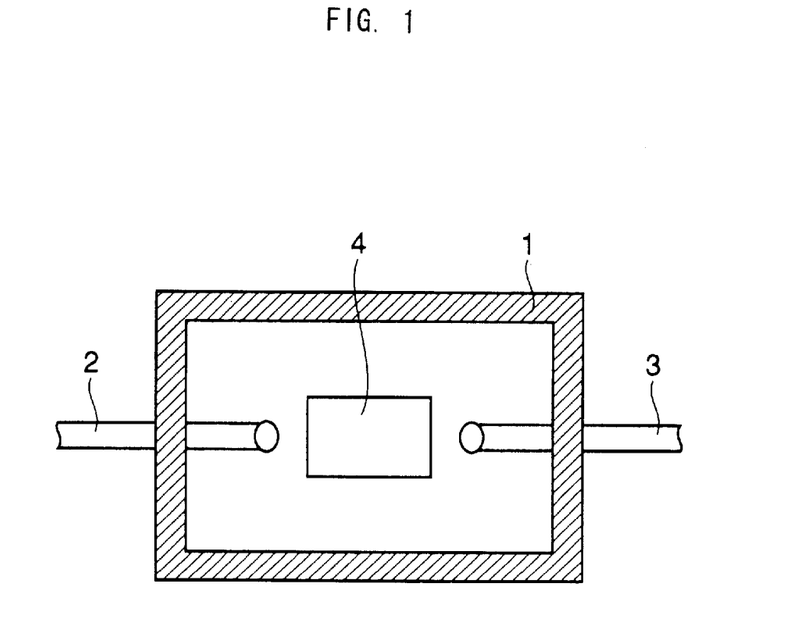
FIG. 1 is a sectional view illustrating an example of the dielectric resonator of the present invention.

The dielectric ceramics of the invention are most suitably used as a dielectric ceramics of a dielectric resonator. FIG. 1 shows a schematic diagram of a TE mode dielectric resonator. In the dielectric resonator of FIG. 1, an input terminal 2 and an output terminal 3 are disposed on the opposite sides of the inner wall of a metal case 1, and a dielectric ceramics 4 composed of the above-mentioned dielectric ceramics is disposed between the input and output terminals 2 and 3. In such TE mode dielectric resonator, microwave is inputted from the input terminal 2 and, by the reflection at boundaries between the dielectric ceramics 4 and free space, the microwave is confined within the dielectric ceramics 4 and causes resonance at a specific frequency.

This signal makes electromagnetic coupling with the output terminal 3 and is outputted.

It is of course possible to apply the dielectric ceramics of the invention to a co-axial resonator using TEM mode, strip line resonator, TM mode dielectric resonator and other resonators, although these are not shown. In addition, the dielectric resonator can be constructed by disposing the input terminal 2 and output terminal 3 directly to the dielectric ceramics 4.

The dielectric ceramics 4 is a resonance medium composed of a dielectric ceramics of the invention, having a predetermined shape. Its shape may be in any solid one which can cause resonance, such as cube, flat, disc, cylinder and polygonal prism. The frequency of a high frequency signal to be inputted is about 1 to 500 GHz, and about 2 GHz to 80 GHz is practically suitable as a resonance frequency.

Thus, since a dielectric ceramics of the invention can realize a high dielectric constant $\epsilon$ r and a high Q value in a high frequency region, it can be suitably applied to resonator materials, MIC dielectric substrate materials, dielectric waveguides, dielectric antennas and other various electronic parts.

EXAMPLES

The present invention will hereinafter be described in detail by taking examples.

Example I

As a starting material, there were used each powder of a rare earth oxide, aluminum oxide ($Al_2O_3$), calcium carbonate ($CaCO_3$), strontium carbonate ($SrCO_3$) and titanium oxide ($TiO_2$), which are all of high purity. After these were weighed out so as to be the mole ratios a, b, c and d in Table 1, pure water was added thereto and mixed. This mixed material was subjected to wet blending, and grinding by a ball mill for about 20 hours until the average particle diameter was not more than 2.0 $\mu$m. This mixture was dried and calcinated at 1330° C. for 2 hours, to obtain a calcination. To this, manganese carbonate ($MnCO_3$), tungsten oxide ($WO_3$) and tantalum oxide ($Ta_2O_5$) were added and mixed so as to have the values (% by weight) shown in Table 1, and pure water was added thereto. This mixed material was then subjected to wet blending and grinding by a ball mill for about 20 hours until its average particle diameter was not more than 2.0 $\mu$m.

To the obtained slurry, a 5% by weight of a binder was added and a particle sizing was conducted by a spray drying. The resulting sized-particle body was molded into a disk at pressure of about 1 ton/cm², and degreased. The degreased molded body was held at 1630° C. to 1680° C. for 5 to 10 hours, and the temperature of 1630 to 1680° C. was lowered to 1300° C. at 310 to 500° C./hour, and the temperature of 1300° C. was lowered to 1100° C. at 5 to 100° C./hour. Thereafter, it was held at 1100 to 1050° C. for 30 hours, and held at 1050 to 1000° C. for 30 hours, followed by firing.

The disk part (the main surface) of the obtained sintered body was subjected to surface grinding and ultrasonic cleaning in acetone, and dried at 150° C. for 1 hour. By using cylindrical resonator method, dielectric constant $\epsilon$ r, Q value, and the temperature coefficient of resonance frequency $\epsilon$ r were measured at a measuring frequency of 3.5 to 4.5 GHz. This Q value was converted to a Q value at 1 GHz, from the relationship: (Q value)×(Measuring frequency f)=(Constant), which is generally held in microwave dielectric. As to the temperature coefficient of resonance frequency, the temperature coefficient of resonance frequency at 25 to 85° C. was calculated taking the resonance frequency at 25° C. as reference.

The sintered body was arranged by using an ion thinning device produced by Technoorg Linda. By means of observation with a transmission electron microscope, analysis with a selected area electron diffraction image, and EDS analysis, the percent by volume of $\beta$-$Al_2O_3$ and/or $\theta$-$Al_2O_3$ contained in the sintered body, the crystal particle diameter, the aspect ratio, and the percent by volume of the crystal of which crystal system is hexagonal and/or orthorhombic, were measured by the following steps (2a) to (2f).

(2a) The crystals in the inside of the sintered body were observed with respect to an area of not less than $1 \times 10^{-3}$ mm² by selected area electron diffraction image at a magnification of 5000 times, and the identification and EDS analysis of the crystal structure were carried out with respect to 30 crystals or more.

Figure 2A:
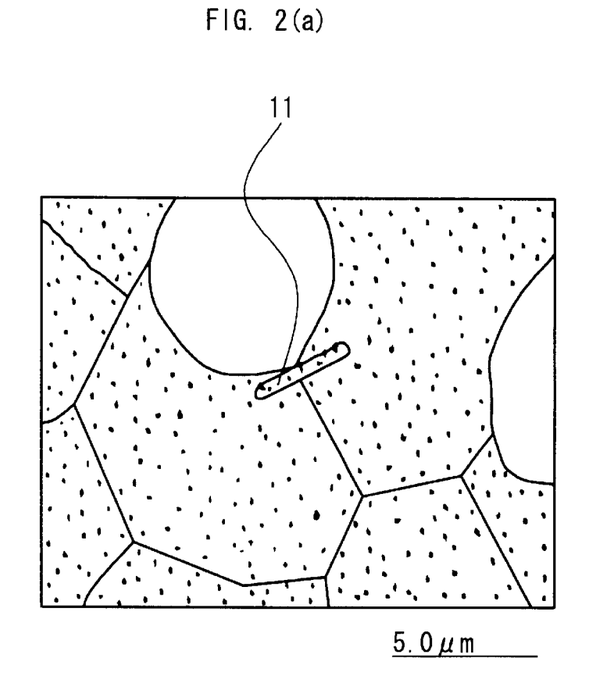
FIGS. 2(a) and 2(b) are schematic views illustrating a selected area electron diffraction image of the dielectric ceramics of the present invention.
Figure 2B:
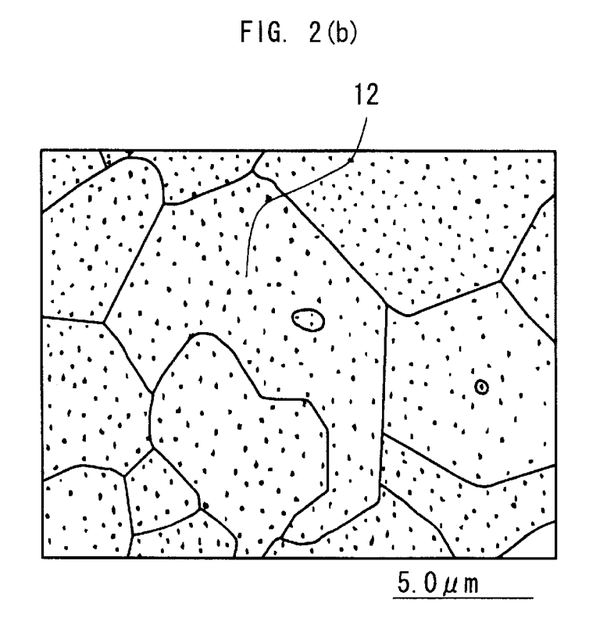
Figure 4:
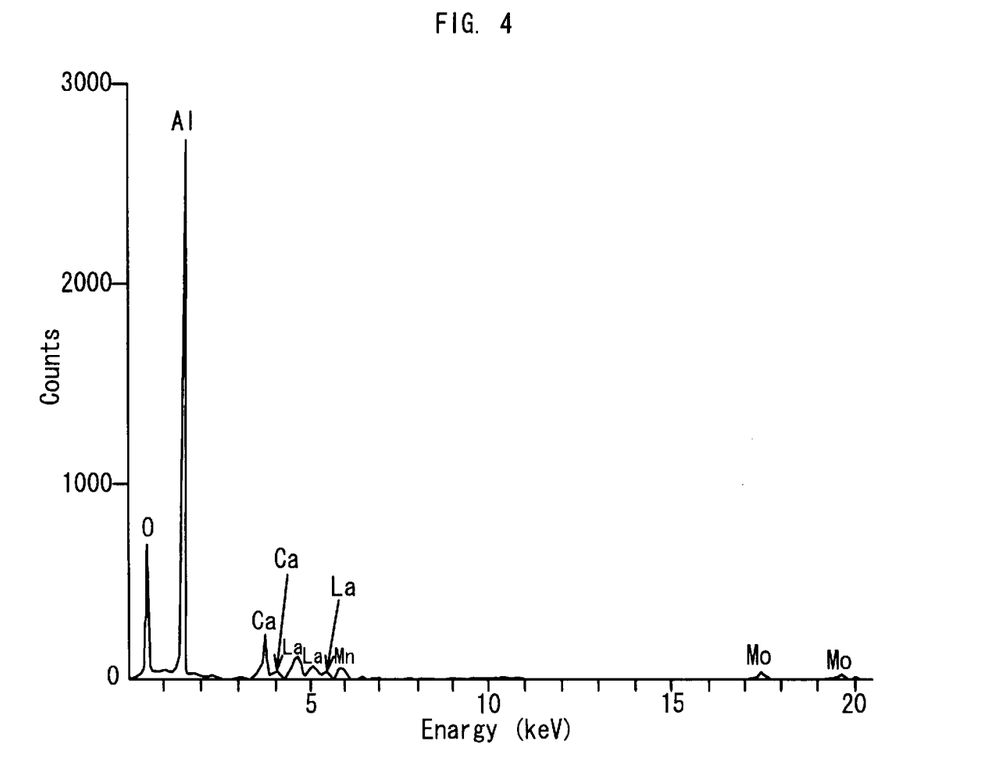
FIG. 4 is a schematic view of the result of an EDS analysis of the crystal particle 11 in FIG. 2(a)
Figure 5:
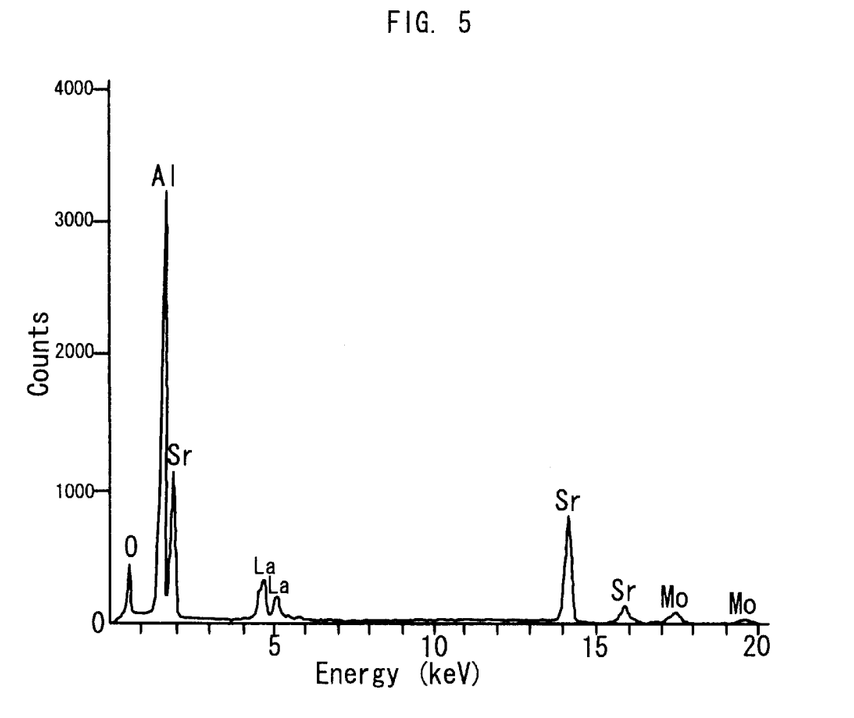
FIG. 5 is a schematic view of the result of an EDS analysis of the crystal particle 12 in FIG. 2(b).

(2b) The selected area electron diffraction image of the crystals in which relatively more Al was present than other crystals and no Ti was detected in the EDS analysis in (2a), was analyzed and their crystal structures were identified. FIGS. 2(a) and 2(b) show examples of schematic diagrams of the selected area electron diffraction images of a crystal particle of $\beta$-$Al_2O_3$ 11 and a crystal particle of $\theta$-$Al_2O_3$ 12, in which a relatively more Al was present than other crystals and no Ti was detected. FIGS. 4 and 5 show examples of the schematic diagrams of the results of EDS analysis with respect to the crystal particles 11 and 12. From FIG. 4, it is found that the crystal particle 11 takes Al as its main component and contains Ca and La. From FIG. 5, it is found that the crystal particle 12 takes Al as its main component and contains Sr and La. In FIGS. 4 and 5, it should be noted that Mo was detected from a sample reinforcing plate.

Figure 3A:
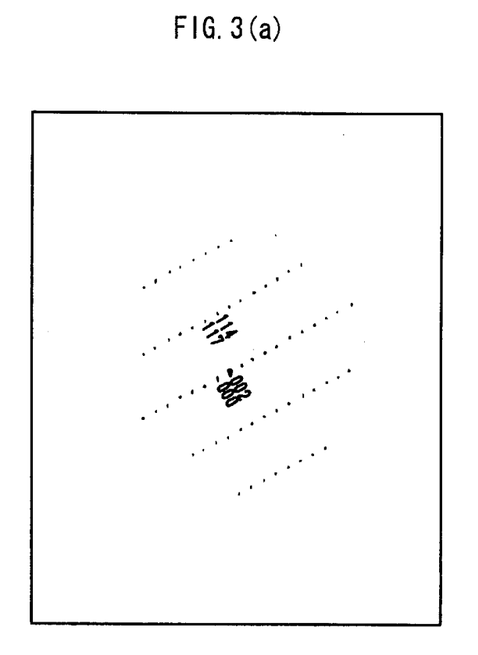
FIGS. 3(a) and 3(b) are schematic views of photographs illustrating the result of analysis of the selected area electron diffraction image of crystal particles 11 and 12 in FIGS. 2(a) and 2(b), respectively.
Figure 3B:
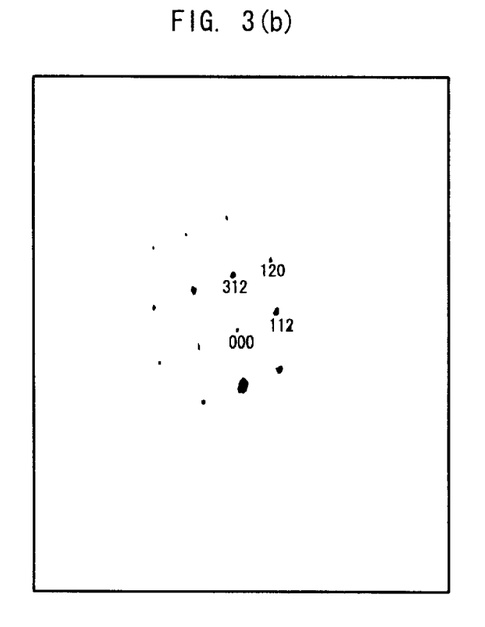

(2c) The crystals having the crystal structure, identified in (2b), which correspond to $\beta$-$Al_2O_3$ of No. 10-0414 of JCPDS-ICDD and/or $\theta$-$Al_2O_3$ of No. 11-0517 of JCPDS-ICDD, were taken as $\beta$-$Al_2O_3$ and/or $\theta$-$Al_2O_3$. For one example, the crystal structure of the crystal particle 11 in FIG. 2(a) was identified and found to be $\beta$-$Al_2O_3$ of No. 10-0414 of JCPDS-ICDD. This result is shown as a schematic diagram in FIG. 3(a). FIG. 3(a) indicates that it was identified as a plane of $\beta$-$Al_2O_3$ of No. 10-0414 of JCPDS-ICDD (h=−1, k=1, l=0). The crystal structure of the crystal particle 12 in FIG. 2(b) was identified and found that it was $\theta$-$Al_2O_3$ of No. 11-0517 of JCPDS-ICDD. This result is shown as a schematic diagram in FIG. 3(b). FIG. 3(a) indicates that it was identified as a plane of $\theta$-$Al_2O_3$ of No. 11-0517 of JCPDS-ICDD (h=−2, k=4, l=−1).

(2d) The proportion of the area of the crystals corresponding to $\beta$-$Al_2O_3$ and/or $\theta$-$Al_2O_3$, to the crystal photograph observed in (2a) was found, and the obtained proportion was taken as a percent by volume of $\beta$-$Al_2O_3$ and/or $\theta$-$Al_2O_3$.

(2e) The average aspect ratio of the crystal of $\beta$-$Al_2O_3$ was found to be 2 to 8, from the crystal photograph.

(2f) There were found a percent by volume of the crystals among the crystals identified in (2a) in which the crystal composed of an oxide containing a rare earth element (Ln), Al, M (M is Ca and/or Sr) and Ti had a hexagonal and/or orthorhombic crystal structure. In finding the percent by volume, of the area of the photograph where the ceramics was present, a percent by area of the crystal composed of the oxide containing a rare earth element (Ln), Al, M (M is Ca and/or Sr) and Ti, was taken as a percent by volume. The crystals composed of $\beta$-$Al_2O_3$ and $\theta$-$Al_2O_3$ were not counted in finding the percent by volume of the crystal composed of hexagonal and/or orthorhombic.

The crystals of which crystal system is hexagonal and/or orthorhombic, which are to be contained in a dielectric ceramic sample of the invention, were identified by at least one or more crystal structures of the hexagonal LaAlO$_3$ of No. 31-0022 of JCPDS-ICDD, the hexagonal AlNdO$_3$ of No. 39-0487 of JCPDS-ICDD, and the orthorhombic CaTiO$_3$ of No. 42-0423 of JCPDS-ICDD. Of the dielectric ceramic samples of the invention, some samples of which crystal structure was identified by the hexagonal LaAlO$_3$ were also identified by the samples of which crystal structure was a cubic SrTiO$_3$ and/or cubic LaTiO$_3$. Further, of the dielectric ceramic samples of the invention, some of the samples of which crystal structure was identified by the hexagonal LaAlO$_3$ were also identified by the samples of which crystal structure was an orthorhombic CaTiO$_3$.

Of the crystals composed of an oxide containing a rare earth element (Ln), Al, M (M is Ca and/or Sr) and Ti, the crystals composed of a crystal system other than hexagonal and/or orthorhombic were regarded that its crystal structure was unclear, or it was for example identified by at least one or more crystal structures such as of tetragonal SrLaAlO$_3$, Sr$_4$Ti$_3$O$_{10}$, Sr$_2$TiO$_4$, Sr$_3$Al$_2$O$_7$ and SrLa$_2$Ti$_{14}$O$_{12}$, and monoclinic SrAl$_2$O$_4$, Nd$_2$Ti$_2$O$_7$ and SrAl$_4$O$_7$.

As a measuring device, a transmission electron microscopea JEM2010F produced by JEOL Corp. and an EDS analyzer VoyagerIV produced by Noran Instruments Corp. were used.

The results are shown in Tables 1 to 3. In Table 1, for example, the sample that the proportion of a rare earth element is 0.1 Y 0.9 La indicates that the mole ratio of Y and La is 0.1:0.9. The ratio of CaO and SrO is indicated in ratio by mole.

As apparent from Tables 1 to 3, as to Sample Nos. 1 to 48 within the scope of the present invention in which β-Al$_2$O$_3$ and/or θ-Al$_2$O$_3$ is present, dielectric constant εr is 30 to 48, and Q value when converted to 1 GHz is 40000 or more. Particularly, when εr is 40 or more, Q value is as high as 45000 or more, thereby providing such excellent dielectric property that c f is within ±30 (ppm/°C.).

On the other hand, as to the dielectric ceramics beyond the scope of the present invention (Nos. 49 to 56), in which neither β-Al$_2$O$_3$ nor θ-Al$_2$O$_3$ is present, εr is low, or Q value is low, or the absolute value of τ f exceeds 30.

TABLE 1

| No. | Rare Earth Element Ratio | Ratio of CaO:SrO CaO | SrO | Ln$_2$O$_x$ a | Al$_2$O$_3$ b | MO = CaO + SrO c | TiO$_2$ d | $\frac{(b+d)}{(a+c)}$ | MnO$_2$ (wt. %) | WO$_3$ (wt. %) | Ta$_2$O$_5$ (wt. %) |
|---|---|---|---|---|---|---|---|---|---|---|---|
| 1 | 0.1Y.0.9La | 0.00 | 1.00 | 0.0800 | 0.0800 | 0.4400 | 0.4000 | 0.923 | 0.01 | 0.00 | 0.00 |
| 2 | 0.1Sm.0.9Nd | 0.50 | 0.50 | 0.1240 | 0.1300 | 0.3730 | 0.3730 | 1.012 | 1.00 | 0.00 | 0.00 |
| 3 | 0.5La.0.5Sm | 0.80 | 0.20 | 0.2140 | 0.2140 | 0.2860 | 0.2860 | 1.000 | 0.04 | 0.00 | 0.00 |
| 4 | Nd | 0.40 | 0.60 | 0.1250 | 0.1260 | 0.3300 | 0.4190 | 1.198 | 0.05 | 0.00 | 0.00 |
| 5 | 0.1La.0.9Nd | 0.90 | 0.10 | 0.1250 | 0.1250 | 0.4170 | 0.3330 | 0.845 | 0.30 | 0.00 | 0.00 |
| 6 | 0.5La.0.5Nd | 0.30 | 0.70 | 0.2090 | 0.2050 | 0.2860 | 0.3000 | 1.020 | 0.00 | 0.00 | 0.01 |
| 7 | 0.1Ce.0.9Sm | 0.50 | 0.50 | 0.1539 | 0.1661 | 0.3300 | 0.3500 | 1.067 | 0.00 | 0.00 | 0.03 |
| 8 | 0.1Ce.0.9Nd | 0.50 | 0.50 | 0.0560 | 0.0560 | 0.4580 | 0.4300 | 0.946 | 0.00 | 0.00 | 0.05 |
| 9 | 0.4Nd.0.6La | 0.10 | 0.90 | 0.0600 | 0.0610 | 0.4954 | 0.3836 | 0.801 | 0.00 | 0.00 | 0.00 |
| 10 | 0.1Pr.0.9Nd | 0.50 | 0.50 | 0.0941 | 0.1009 | 0.4600 | 0.3450 | 0.805 | 0.00 | 0.01 | 0.00 |
| 11 | 0.5Sm.0.5Nd | 0.70 | 0.30 | 0.0770 | 0.0770 | 0.4300 | 0.4160 | 0.972 | 0.00 | 0.05 | 0.00 |
| 12 | Sm | 0.20 | 0.80 | 0.0700 | 0.0560 | 0.4240 | 0.4500 | 1.024 | 0.00 | 0.08 | 0.00 |
| 13 | 0.1Sm.0.9Nd | 0.80 | 0.20 | 0.1320 | 0.1600 | 0.3270 | 0.3810 | 1.179 | 0.00 | 1.00 | 0.00 |
| 14 | 0.5Sm.0.5Nd | 0.50 | 0.50 | 0.1071 | 0.1090 | 0.3539 | 0.4300 | 1.169 | 0.00 | 1.20 | 0.00 |
| 15 | Eu | 0.50 | 0.50 | 0.0600 | 0.0600 | 0.5000 | 0.3800 | 0.786 | 0.00 | 0.00 | 0.00 |
| 16 | 0.1Eu.0.9Nd | 0.40 | 0.60 | 0.1400 | 0.1750 | 0.3350 | 0.3500 | 1.105 | 0.00 | 0.01 | 0.50 |
| 17 | Gd | 0.20 | 0.80 | 0.0600 | 0.0600 | 0.4105 | 0.4695 | 1.125 | 0.00 | 0.03 | 0.05 |
| 18 | 0.1Gd.0.9Nd | 0.80 | 0.20 | 0.0780 | 0.0780 | 0.4220 | 0.4220 | 1.000 | 0.00 | 0.08 | 1.50 |
| 19 | Dy | 0.50 | 0.50 | 0.1166 | 0.1166 | 0.4267 | 0.3401 | 0.841 | 0.00 | 1.00 | 1.00 |
| 20 | 0.1Dy.0.9Nd | 0.40 | 0.60 | 0.1098 | 0.1098 | 0.3902 | 0.3902 | 1.000 | 0.03 | 0.02 | 0.50 |
| 21 | 0.5Dy.0.5Nd | 1.00 | 0.00 | 0.0790 | 0.0790 | 0.4610 | 0.3810 | 0.852 | 0.03 | 0.00 | 0.00 |
| 22 | 0.1Sm.0,9La | 0.50 | 0.50 | 0.0881 | 0.0881 | 0.4119 | 0.4199 | 1.000 | 0.09 | 0.00 | 0.20 |
| 23 | 0.3Nd.0.7La | 0.40 | 0.60 | 0.1072 | 0.1072 | 0.4376 | 0.3480 | 0.836 | 1.00 | 0.00 | 0.01 |
| 24 | 0.1Gd.0.9Eu | 0.20 | 0.80 | 0.0884 | 0.0884 | 0.4100 | 0.4132 | 1.006 | 0.02 | 1.30 | 0.00 |
| 25 | 0.2Dy.0.8Eu | 0.50 | 0.50 | 0.1700 | 0.1760 | 0.3270 | 0.3270 | 1.012 | 0.00 | 0.00 | 0.00 |
| 26 | 0.9Nd.0.1La | 0.30 | 0.70 | 0.2130 | 0.2120 | 0.3440 | 0.2310 | 0.795 | 0.07 | 0.05 | 0.00 |
| 27 | La | 0.00 | 1.00 | 0.1000 | 0.1000 | 0.4000 | 0.4000 | 1.000 | 0.06 | 0.09 | 0.70 |
| 28 | 0.9Nd.0.1La | 0.50 | 0.50 | 0.1200 | 0.1220 | 0.3750 | 0.3830 | 1.020 | 0.01 | 0.00 | 0.00 |
| 29 | La | 0 | 1 | 0.1623 | 0.1623 | 0.3377 | 0.3377 | 1.000 | 0.00 | 0.00 | 0.00 |
| 30 | La | 0 | 1 | 0.1307 | 0.1597 | 0.3548 | 0.3548 | 1.060 | 0.05 | 0.00 | 0.00 |
| 31 | La | 0 | 1 | 0.2105 | 0.1688 | 0.3460 | 0.2747 | 0.797 | 1.00 | 0.00 | 0.00 |
| 32 | La | 0 | 1 | 0.1382 | 0.1438 | 0.3769 | 0.3411 | 0.941 | 0.50 | 0.00 | 0.00 |
| 33 | La | 0 | 1 | 0.1707 | 0.2086 | 0.3460 | 0.2747 | 0.935 | 0.20 | 0.00 | 0.00 |
| 34 | La | 0 | 1 | 0.1061 | 0.1061 | 0.3939 | 0.3939 | 1.000 | 0.10 | 0.00 | 0.00 |
| 35 | La | 0 | 1 | 0.1801 | 0.1444 | 0.3040 | 0.3715 | 1.066 | 0.01 | 0.01 | 0.00 |
| 36 | La | 0 | 1 | 0.1452 | 0.1452 | 0.3956 | 0.3140 | 0.849 | 0.05 | 0.05 | 0.00 |
| 37 | La | 0.1 | 0.9 | 0.1163 | 0.1259 | 0.4092 | 0.3486 | 0.903 | 1.00 | 0.01 | 0.00 |
| 38 | La | 0 | 1 | 0.1211 | 0.1211 | 0.3789 | 0.3789 | 1.000 | 0.02 | 0.01 | 0.00 |
| 39 | La | 0 | 1 | 0.1276 | 0.1383 | 0.3597 | 0.3744 | 1.052 | 0.50 | 0.00 | 0.00 |
| 40 | La | 0 | 1 | 0.2162 | 0.1631 | 0.3041 | 0.3166 | 0.922 | 0.40 | 0.00 | 0.00 |
| 41 | La | 0.9 | 0.1 | 0.1410 | 0.1410 | 0.3590 | 0.3590 | 1.000 | 0.20 | 0.00 | 0.00 |
| 42 | La | 1 | 0 | 0.1707 | 0.2086 | 0.3166 | 0.3041 | 1.052 | 0.00 | 0.00 | 0.00 |
| 43 | La | 1 | 0 | 0.1071 | 0.1050 | 0.3506 | 0.4373 | 1.185 | 0.00 | 1.00 | 0.01 |
| 44 | La | 1 | 0 | 0.1125 | 0.1375 | 0.4125 | 0.3375 | 0.905 | 0.10 | 0.00 | 2.90 |

TABLE 1-continued

| No. | Rare Earth Element Ratio | Ratio of CAO:SrO CaO | SrO | Ln₂Oₓ a | Al₂O₃ b | MO = CaO + SrO c | TiO₂ d | (b + d)/(a + c) | MnO₂ (wt. %) | WO₃ (wt. %) | Ta₂O₅ (wt. %) |
|---|---|---|---|---|---|---|---|---|---|---|---|
| 45 | La | 1 | 0 | 0.1515 | 0.1143 | 0.4185 | 0.3157 | 0.754 | 0.05 | 0.50 | 0.00 |
| 46 | La | 1 | 0 | 0.1329 | 0.1658 | 0.3121 | 0.3892 | 1.247 | 0.00 | 0.00 | 2.00 |
| 47 | La | 1 | 0 | 0.1897 | 0.1897 | 0.3103 | 0.3103 | 1.000 | 0.03 | 0.00 | 0.00 |
| 48 | La | 1 | 0 | 0.1308 | 0.1114 | 0.3979 | 0.3599 | 0.891 | 0.00 | 0.00 | 0.00 |
| *49 | Y | 0.00 | 1.00 | 0.0800 | 0.0800 | 0.4200 | 0.4200 | 1.000 | 0.00 | 0.00 | 0.00 |
| *50 | 0.9Yb.0.1Ce | 0.00 | 1.00 | 0.2000 | 0.2100 | 0.2900 | 0.3000 | 1.041 | 0.00 | 0.00 | 0.00 |
| *51 | Nd | 0.00 | 1.00 | 0.0660 | 0.0500 | 0.4850 | 0.3990 | 0.815 | 0.00 | 0.00 | 0.00 |
| *52 | 0.1Dy.0.9Gd | 0.50 | 0.50 | 0.2100 | 0.2000 | 0.2900 | 0.3000 | 1.000 | 0.00 | 0.00 | 0.00 |
| *53 | Ce | 1.00 | 0.00 | 0.0750 | 0.0555 | 0.4900 | 0.3795 | 0.770 | 0.00 | 0.00 | 0.00 |
| *54 | 0.5Pr.0.5Eu | 1.00 | 0.00 | 0.1130 | 0.1260 | 0.4000 | 0.3610 | 0.949 | 0.00 | 0.00 | 0.00 |
| *55 | 0.5Er.0.5La | 1.00 | 0.00 | 0.0675 | 0.0675 | 0.3850 | 0.4800 | 1.210 | 0.00 | 0.00 | 0.00 |
| *56 | 0.5Nd.0.5Y | 1.00 | 0.00 | 0.1600 | 0.0900 | 0.3720 | 0.3780 | 0.880 | 0.00 | 0.00 | 0.00 |

Mark "*" indicates Sample not falling within the scope of the invention.

TABLE 2

| No. | MnO₂ + WO₃ + Ta₂O₅ (wt. %) | Holding time at 1630–1680° C. (hr) | Lowering rate to 1300° C. (° C./hr) | Lowering rate to 1100° C. (° C./hr) | Holding time at 1100~1050° C. (hr) | Holding time at 1050~1000° C. (hr) |
|---|---|---|---|---|---|---|
| 1 | 0.01 | 5 | 400 | 8 | 30 | 30 |
| 2 | 1.00 | 7 | 350 | 10 | 30 | 30 |
| 3 | 0.04 | 8 | 400 | 20 | 30 | 30 |
| 4 | 0.50 | 9 | 450 | 30 | 30 | 30 |
| 5 | 0.30 | 6 | 350 | 40 | 30 | 30 |
| 6 | 0.01 | 7 | 400 | 15 | 30 | 30 |
| 7 | 0.03 | 8 | 500 | 20 | 30 | 30 |
| 8 | 0.05 | 10 | 310 | 25 | 30 | 30 |
| 9 | 0.00 | 6 | 400 | 8 | 30 | 30 |
| 10 | 0.01 | 7 | 350 | 10 | 30 | 30 |
| 11 | 0.05 | 8 | 400 | 20 | 30 | 30 |
| 12 | 0.08 | 9 | 450 | 30 | 30 | 30 |
| 13 | 1.00 | 6 | 350 | 40 | 30 | 30 |
| 14 | 1.20 | 7 | 400 | 15 | 30 | 30 |
| 15 | 0.00 | 8 | 450 | 20 | 30 | 30 |
| 16 | 0.51 | 9 | 400 | 25 | 30 | 30 |
| 17 | 0.08 | 6 | 400 | 8 | 30 | 30 |
| 18 | 1.58 | 7 | 350 | 10 | 30 | 30 |
| 19 | 2.00 | 8 | 400 | 20 | 30 | 30 |
| 20 | 0.55 | 9 | 450 | 30 | 30 | 30 |
| 21 | 0.03 | 6 | 350 | 40 | 30 | 30 |
| 22 | 0.29 | 7 | 400 | 15 | 30 | 30 |
| 23 | 1.01 | 8 | 450 | 20 | 30 | 30 |
| 24 | 1.32 | 9 | 400 | 25 | 30 | 30 |
| 25 | 0.00 | 6 | 400 | 8 | 30 | 30 |
| 26 | 0.12 | 7 | 350 | 10 | 30 | 30 |
| 27 | 0.85 | 8 | 400 | 20 | 30 | 30 |
| 28 | 0.01 | 9 | 450 | 30 | 30 | 30 |
| 29 | 0.00 | 6 | 350 | 40 | 30 | 30 |
| 30 | 0.05 | 7 | 400 | 15 | 30 | 30 |
| 31 | 1.00 | 8 | 450 | 20 | 30 | 30 |
| 32 | 0.50 | 10 | 400 | 25 | 30 | 30 |
| 33 | 0.20 | 6 | 400 | 8 | 30 | 30 |
| 34 | 0.10 | 7 | 350 | 10 | 30 | 30 |
| 35 | 0.02 | 8 | 400 | 20 | 30 | 30 |
| 36 | 0.10 | 9 | 450 | 30 | 30 | 30 |
| 37 | 1.01 | 5 | 350 | 40 | 30 | 30 |
| 38 | 0.03 | 7 | 400 | 15 | 30 | 30 |
| 39 | 0.50 | 8 | 450 | 20 | 30 | 30 |
| 40 | 0.40 | 9 | 400 | 25 | 30 | 30 |
| 41 | 0.20 | 6 | 400 | 8 | 30 | 30 |
| 42 | 0.00 | 7 | 350 | 10 | 30 | 30 |
| 43 | 1.01 | 8 | 400 | 20 | 30 | 30 |
| 44 | 3.00 | 9 | 450 | 30 | 30 | 30 |
| 45 | 0.55 | 6 | 350 | 40 | 30 | 30 |
| 46 | 2.00 | 7 | 400 | 15 | 30 | 30 |
| 47 | 0.03 | 8 | 450 | 20 | 30 | 30 |
| 48 | 0.00 | 9 | 400 | 25 | 30 | 30 |
| *49 | 0.00 | 2 | 400 | 30 | 8 | 30 |
| *50 | 0.00 | 14 | 350 | 25 | 10 | 30 |
| *51 | 0.00 | 5 | 100 | 20 | 20 | 20 |

TABLE 2-continued

| No. | MnO$_2$ + WO$_3$ + Ta$_2$O$_5$ (wt. %) | Holding time at 1630–1680° C. (hr) | Lowering rate to 1300° C. (° C./hr) | Lowering rate to 1100° C. (° C./hr) | Holding time at 1100~1050° C. (hr) | Holding time at 1050~1000° C. (hr) |
|---|---|---|---|---|---|---|
| *52 | 0.00 | 7 | 700 | 30 | 20 | 20 |
| *53 | 0.00 | 6 | 350 | 3 | 20 | 20 |
| *54 | 0.00 | 7 | 400 | 300 | 20 | 20 |
| *55 | 0.00 | 8 | 450 | 20 | 5 | 20 |
| *56 | 0.00 | 9 | 450 | 25 | 5 | 5 |

Mark "*" indicates Sample not falling within the scope of the invention.

TABLE 3

| | % by volume | | | Cristal of Hexagonal | Dielectric Properties | | |
|---|---|---|---|---|---|---|---|
| No. | β-Al$_2$O$_3$ | θ-Al$_2$O$_3$ | β-Al$_2$O$_3$ + θ-Al$_2$O$_3$ | and/or Orthorhombic (vol. %) | εr | Q | τf (ppm/° C.) |
| 1 | 0 | 0.00001 | 0.00001 | 97 | 45.2 | 45000 | 26.3 |
| 2 | 0.0005 | 0.0005 | 0.001 | 94 | 34.8 | 48000 | −26.9 |
| 3 | 2.15 | 0.12 | 2.27 | 99 | 31.2 | 50000 | 2.0 |
| 4 | 0.001 | 0.001 | 0.002 | 90 | 39.9 | 43000 | −16.5 |
| 5 | 0.002 | 0.00005 | 0.00205 | 99 | 38.2 | 48000 | −14.0 |
| 6 | 0.30 | 2.70 | 3.00 | 94 | 32.4 | 59000 | −26.5 |
| 7 | 0.00008 | 0.0001 | 0.00018 | 98 | 38.9 | 43000 | −0.5 |
| 8 | 0.0002 | 0.0003 | 0.0005 | 95 | 43.2 | 45000 | 11.9 |
| 9 | 0 | 0.0005 | 0.0005 | 92 | 39.0 | 40000 | 29.0 |
| 10 | 0.020 | 0.003 | 0.023 | 100 | 37.5 | 43000 | 28.4 |
| 11 | 0.0005 | 0.0010 | 0.0015 | 99 | 46.8 | 46000 | 29.1 |
| 12 | 0.01 | 0.06 | 0.07 | 93 | 48.0 | 49000 | 21.2 |
| 13 | 0.31 | 0.11 | 0.42 | 93 | 45.2 | 50000 | −4.5 |
| 14 | 0.15 | 0.29 | 0.44 | 99 | 38.8 | 42000 | 11.1 |
| 15 | 0.00006 | 0.00008 | 0.00014 | 90 | 36.0 | 40000 | 16.5 |
| 16 | 0.02 | 0.60 | 0.62 | 100 | 35.5 | 44000 | −14.3 |
| 17 | 0.002 | 0.004 | 0.006 | 100 | 34.5 | 42000 | 19.2 |
| 18 | 0.05 | 0.05 | 0.10 | 97 | 42.5 | 52000 | 21.1 |
| 19 | 0.07 | 0.13 | 0.20 | 100 | 41.1 | 58000 | 1.1 |
| 20 | 0.12 | 0.26 | 0.38 | 99 | 39.5 | 54000 | 2.1 |
| 21 | 0.25 | 0.00 | 0.25 | 100 | 34.0 | 51000 | 2.7 |
| 22 | 0.017 | 0.021 | 0.038 | 98 | 43.2 | 45000 | 27.4 |
| 23 | 0.20 | 0.19 | 0.39 | 100 | 42.4 | 51000 | 4.0 |
| 24 | 0.005 | 0.030 | 0.035 | 95 | 39.2 | 42000 | 21.2 |
| 25 | 0.04 | 0.41 | 0.45 | 85 | 38.7 | 40000 | −2.5 |
| 26 | 0.30 | 0.60 | 0.90 | 98 | 31.9 | 46000 | 29.5 |
| 27 | 0.10 | 0 | 0.10 | 99 | 44.1 | 45000 | 1.1 |
| 28 | 0.02 | 0.13 | 0.15 | 99 | 44.0 | 45000 | −3.5 |
| 29 | 0 | 0.20 | 0.20 | 96 | 37.1 | 45000 | −10.8 |
| 30 | 0 | 0.14 | 0.14 | 97 | 38.5 | 46000 | 6.1 |
| 31 | 0 | 0.42 | 0.42 | 90 | 31.8 | 53000 | −26.8 |
| 32 | 0 | 0.05 | 0.05 | 99 | 38.2 | 58000 | 3.5 |
| 33 | 0 | 0.003 | 0.003 | 96 | 34.0 | 60000 | −21.5 |
| 34 | 0 | 0.005 | 0.005 | 91 | 45.9 | 48000 | 29.9 |
| 35 | 0 | 0.05 | 0.05 | 98 | 38.1 | 56000 | −3.1 |
| 36 | 0 | 0.06 | 0.06 | 99 | 33.2 | 43000 | −6.8 |
| 37 | 0 | 0.09 | 0.09 | 97 | 37.9 | 55000 | 22.3 |
| 38 | 0 | 0.48 | 0.48 | 100 | 45.2 | 57000 | 18.1 |
| 39 | 0.0020 | 1.14 | 1.1420 | 95 | 44.0 | 48000 | 12.9 |
| 40 | 0 | 0.18 | 0.18 | 100 | 36.2 | 47000 | −19.6 |
| 41 | 0 | 0.05 | 0.05 | 99 | 39.5 | 68000 | 2.2 |
| 42 | 0.17 | 0.27 | 0.44 | 90 | 31.0 | 40000 | −16.8 |
| 43 | 0.010 | 0 | 0.010 | 100 | 42.0 | 45000 | 29.9 |
| 44 | 0.006 | 0 | 0.006 | 100 | 35.1 | 48000 | 19.1 |
| 45 | 0.006 | 0 | 0.006 | 97 | 32.8 | 58000 | 4.2 |
| 46 | 0.009 | 0 | 0.009 | 96 | 32.0 | 49000 | 2.7 |
| 47 | 0.50 | 0 | 0.50 | 98 | 31.0 | 78000 | −25.1 |
| 48 | 0.14 | 0.11 | 0.25 | 100 | 32.0 | 40000 | 12.8 |
| *49 | 0 | 0 | 0 | 79 | 35.6 | 18000 | 35.6 |
| *50 | 0 | 0 | 0 | 75 | 40.2 | 9000 | −39.7 |
| *51 | 0 | 0 | 0 | 77 | 29.7 | 12000 | −34.1 |
| *52 | 0 | 0 | 0 | 76 | 36.9 | 14000 | −41.9 |
| *53 | 0 | 0 | 0 | 78 | 33.0 | 15000 | 44.5 |
| *54 | 0 | 0 | 0 | 79 | 31.0 | 16000 | −38.2 |
| *55 | 0 | 0 | 0 | 76 | 33.5 | 17000 | 40.9 |
| *56 | 0 | 0 | 0 | 75 | 38.5 | 13000 | 6.6 |

Mark "*" indicates Sample not falling within the scope of the invention.

Example II

A dielectric ceramics was prepared by the following steps (1) to (8).

(1) As a starting material, there were used each powder of a high purity rare earth oxide and a high purity aluminum oxide ($Al_2O_3$). After these were weighed out so as to be the mole ratios in Table 4, pure water was added thereto and mixed. This mixed material was subjected to wet blending and grinding by a ball mill for about 20 hours until the average particle diameter was not more than 2.0 μm.

(2) This mixture was dried and calcinated at 1200° C. for 2 hours, to obtain a calcination of which main crystal phase was $LnAlO_{(X+3)/2}$ ($3 \leq x \leq 4$).

(3) Separately, there were used each powder of calcium carbonate ($CaCO_3$), strontium carbonate ($SrCO_3$) and titanium oxide ($TiO_2$). After these were weighed out so as to be a mole ratio in Table 4, pure water was added thereto, and this was subjected to wet blending and grinding by a ball mill for about 20 hours until the average particle diameter of the mixed material was not more than 2.0 μm.

(4) This mixture was dried and calcinated at 1200° C. for 2 hours, to obtain a calcination of which main crystal phase is $MTiO_3$ (M is Ca and/or Sr).

(5) The mixed calcination of the rare earth oxide and $Al_2O_3$, and the mixed calcination of $MTiO_3$ and $TiO_2$ were mixed together and pure water was added thereto. This was subjected to wet blending and grinding by a ball mill for about 20 hours until the average particle diameter of the mixed material was not more than 2.0 μm.

(6) To the obtained slurry, a 5% by weight of a binder was added and a particle sizing was conducted by spray drying.

(7) The obtained particle-sized body was molded into a disk at pressure of about 1 ton/cm².

(8) The temperature from 1000° C. to 1400° C. was elevated at a mean temperature elevating rate of 5 to 100° C./hour, and the temperature from not less than 1400° C. was elevated at a temperature elevating rate of 310 to 500° C./hour, followed by firing in the atmosphere at 1500 to 1700° C. for at least 15 hours or more.

In the same manner as in Example I, ε r, Q value, and temperature coefficient of resonance frequency ε r were measured.

Further, the particle diameter and crystal phase of each crystal were measured by the following steps (a) to (e).

(a) From the interior of the sintered body, four area were selected at random to take samples. These samples were subjected to surface grinding and mirror finish. Thereafter, a heat treatment was conducted at 1450° C. for 15 minutes by using thermal etching method, so that the crystal shape can be observed by a SEM image.

(b) Using a wavelength dispersive X-ray micro-analyzer, photographs of reflection electron images of the surface of each sample after thermal treatment were taken at 15 kV in accelerating voltage, about $5 \times 10^{-10}$ in probe current, and 500 to 2000 times in magnification.

(c) With respect to about 50 to 100 pieces in each of the photographs obtained in (b), their respective crystal particle diameters were measured. The particle diameter was measured by image analysis method. Particle diameter Hd was found as follows.

$$Hd = 2(A/\pi)^{1/2}$$

wherein A is the area within a particle.

(d) With respect to all the crystals having a particle diameter of 3 to 100 μm in the crystals in (b), under the conditions of 15 kV in accelerating voltage and $1.0 \times 10^{-7}$ A to $1.0 \times 10^8$ A in probe current, the intensity of characteristic X-ray of each of the elements of a rare earth element (Ln), Al, M (M is Ca and/or Sr) and T, was found and their respective average values of the intensity of the characteristic X-ray, $I_{Ln}$, $I_{Al}$, $I_M$, and $I_{Ti}$, were found. $I_M$ was to be the sum of the average value of the characteristic X-ray intensity of Ca and the average value of the characteristic X-ray intensity of Sr. When plural rare earth elements were contained, $I_{Ln}$ was to be the sum of the average values of the intensities of the contained rare earth elements. When the intensities of the rare earth element (Ln) and AL were larger than the average value, it was to be a crystal of which main phase was a crystal phase composed of the oxide of the rare earth element (Ln) and Al. When the intensities of M (M is Ca and/or Sr) and Ti were larger than the average value, it was to be a crystal of which main phase was a crystal phase composed of the oxide of M (M is Ca and/or Sr) and Ti.

However, the crystals in which all intensities of a rare earth element (Ln), Al, Ca and Ti were larger than the average value were taken as neither a crystal of which main phase is a crystal phase composed of the oxide of a rare earth element (Ln) and Al, nor a crystal of which main phase of a crystal phase composed of the oxide of M (M is Ca and/or Sr) and Ti. Also, the crystals having a particle diameter of not more than 3 μm were under the influence of other crystals, thus failing to obtain accurate intensity value. Therefore, these were confirmed by a transmission electron microscope (TEM) and were found to be a crystal of which main phase is a crystal phase composed of the oxide of a rare earth element (Ln) and Al.

(e) From the above (a) to (d), there was calculated the average particle diameter of the crystals of which main phase was a crystal phase composed of the oxide of M (M is Ca and/or Sr) and Ti, and the crystal of which main phase is a crystal phase composed of the oxide of a rare earth element (Ln) and Al.

These results are shown in Tables 4 to 6. As apparent from Tables 4 to 6, as to Sample Nos. 57 to 87 within the scope of the present invention, dielectric constant ε r is 30 to 47, and Q value when converted to 1 GHz is 35000 or more. Particularly, when ε r is 40 or more, Q value is as high as 40000 or more, thereby providing such excellent dielectric property that τ f is within ±30 (ppm/° C.).

On the other hand, as to the dielectric ceramics beyond the scope of the present invention (Nos. 88 to 94), ε r is low, or Q value is low, or the absolute value of τ f exceeds 30.

TABLE 4

| | Mole Ratio of Rare Earth Element Oxide | | | | | | CaO | SrO |
|---|---|---|---|---|---|---|---|---|
| | 1 | | 2 | | 3 | | | |
| No. | Kind | Mole Ratio | Kind | Mole Ratio | Kind | Mole Ratio | Mole Ratio | Mole Ratio |
| 57 | Sm2O3 | 0.0210 | Yb2O3 | 0.0580 | Nil | | 0.2100 | 0.1560 |
| 58 | Nd2O3 | 0.1240 | Nil | | Nil | | 0.1420 | 0.2310 |
| 59 | Nd2O3 | 0.0790 | Nil | | Nil | | 0.0110 | 0.4590 |
| 60 | Nd2O3 | 0.1000 | Yb2O3 | 0.0250 | Nil | | 0.3330 | 0.0000 |
| 61 | Y2O3 | 0.0900 | Pr3O4 | 0.0350 | Nil | | 0.4000 | 0.0170 |
| 62 | Nd2O3 | 0.1400 | Nil | | Nil | | 0.3000 | 0.1300 |
| 63 | Sm2O3 | 0.0800 | La2O3 | 0.0260 | Nil | | 0.0510 | 0.3430 |
| 64 | Ce2O3 | 0.0200 | La2O3 | 0.0681 | Nil | | 0.3000 | 0.1119 |
| 65 | Nd2O3 | 0.0580 | Nil | | Nil | | 0.1000 | 0.3800 |
| 66 | La2O3 | 0.0550 | Gd2O3 | 0.0391 | Nil | | 0.0000 | 0.4587 |
| 67 | Dy2O3 | 0.1140 | Eu2O3 | 0.1000 | Nil | | 0.0900 | 0.1980 |
| 68 | Eu2O3 | 0.1700 | Nil | | Nil | | 0.0200 | 0.3670 |
| 69 | Dy2O3 | 0.0900 | Tb2O3 | 0.0420 | Nil | | 0.3000 | 0.0270 |
| 70 | Eu2O3 | 0.0100 | Tb2O3 | 0.1900 | Nil | | 0.2830 | 0.0030 |
| 71 | Gd2O3 | 0.0650 | Nil | | Nil | | 0.0100 | 0.4900 |
| 72 | Tb2O3 | 0.1120 | Ho2O3 | 0.0180 | Nil | | 0.3000 | 0.1350 |
| 73 | La2O3 | 0.1060 | Er2O3 | 0.0440 | Nil | | 0.0000 | 0.3000 |
| 74 | La2O3 | 0.0710 | Y2O3 | 0.0070 | Nil | | 0.1400 | 0.2820 |
| 75 | Nd2O3 | 0.1110 | Pr3O4 | 0.0056 | Nil | | 0.1300 | 0.2968 |
| 76 | Nd2O3 | 0.1098 | Nil | | Nil | | 0.1000 | 0.2902 |
| 77 | Nd2O3 | 0.0790 | Nil | | Nil | | 0.4700 | 0.0000 |
| 78 | Nd2O3 | 0.0700 | Dy2O3 | 0.0181 | Nil | | 0.0800 | 0.3319 |
| 79 | Nd2O3 | 0.0700 | Sm2O3 | 0.0172 | La2O3 | 0.0200 | 0.1400 | 0.2976 |
| 80 | Nd2O3 | 0.0500 | Eu2O3 | 0.0230 | Gd2O3 | 0.0154 | 0.2950 | 0.1642 |
| 81 | Sm2O3 | 0.2357 | Nil | | Nil | | 0.2400 | 0.0866 |
| 82 | Dy2O3 | 0.0500 | Nil | | Nil | | 0.0600 | 0.3690 |
| 83 | Eu2O3 | 0.1000 | Dy2O3 | 0.0067 | Nil | | 0.2963 | 0.0370 |
| 84 | Dy2O3 | 0.0500 | Gd2O3 | 0.0726 | Nil | | 0.0310 | 0.4778 |
| 85 | Nd2O3 | 0.0020 | Eu2O3 | 0.1440 | Nil | | 0.1600 | 0.1100 |
| 86 | Sm2O3 | 0.0010 | Tb2O3 | 0.0780 | Nil | | 0.0000 | 0.3710 |
| 87 | Dy2O3 | 0.0500 | Eu2O3 | 0.1500 | Nil | | 0.3700 | 0.0000 |
| *88 | Y2O3 | 0.0520 | Er2O3 | 0.0421 | Nil | | 0.3400 | 0.1187 |
| *89 | Yb2O3 | 0.0540 | CeO2 | 0.0360 | Nil | | 0.2962 | 0.1638 |
| *90 | Pr3O4 | 0.1270 | Eu2O3 | 0.0270 | Nil | | 0.2700 | 0.1070 |
| *91 | Y2O3 | 0.0630 | La2O3 | 0.0270 | Ho2O3 | 0.0100 | 0.0010 | 0.4290 |
| *92 | Sm2O3 | 0.1400 | Nil | | Nil | | 0.2900 | 0.1400 |
| *93 | Sm2O3 | 0.1400 | Nil | | Nil | | 0.3200 | 0.1100 |
| *94 | Dy2O3 | 0.0900 | Y2O3 | 0.0420 | Nil | | 0.3000 | 0.0270 |

Mark "*" indicates Sample not falling within the scope of the invention.

TABLE 5

| | Mole Ratio | | | | | Mean elevating rate in 1000–1400° C. (° C./hr) | Mean elevating rate in not less than 1400° C. (° C./hr) | Firing time in 1500–1700° C. (hr) |
|---|---|---|---|---|---|---|---|---|
| No. | R.E.E.O.[1) ] a | A/2O3 b | CaO + SrO c | TiO2 d | (b + d)/(a + c) | | | |
| 57 | 0.0790 | 0.1800 | 0.3660 | 0.3750 | 1.2472 | 10 | 315 | 65.0 |
| 58 | 0.1240 | 0.1280 | 0.3730 | 0.3750 | 1.0121 | 22 | 350 | 17.4 |
| 59 | 0.0790 | 0.1100 | 0.4700 | 0.3410 | 0.8215 | 5 | 380 | 36.9 |
| 60 | 0.1250 | 0.1150 | 0.3330 | 0.4270 | 1.1834 | 22 | 350 | 23.5 |
| 61 | 0.1250 | 0.1390 | 0.4170 | 0.3190 | 0.8450 | 22 | 370 | 20.4 |
| 62 | 0.1400 | 0.1000 | 0.4300 | 0.3300 | 0.7544 | 13 | 420 | 57.3 |
| 63 | 0.1060 | 0.0600 | 0.3940 | 0.4400 | 1.0000 | 100 | 380 | 30.8 |
| 64 | 0.0681 | 0.0600 | 0.4119 | 0.4400 | 1.0000 | 55 | 370 | 27.7 |
| 65 | 0.0560 | 0.0840 | 0.4800 | 0.3800 | 0.8657 | 25 | 380 | 28.3 |
| 66 | 0.0941 | 0.1072 | 0.4587 | 0.3400 | 0.8090 | 25 | 410 | 23.5 |
| 67 | 0.2140 | 0.0900 | 0.2880 | 0.4080 | 0.9920 | 65 | 420 | 26.5 |
| 68 | 0.1700 | 0.0600 | 0.3870 | 0.3830 | 0.7953 | 15 | 440 | 22.0 |
| 69 | 0.1320 | 0.2100 | 0.3270 | 0.3310 | 1.1786 | 55 | 490 | 17.3 |
| 70 | 0.2000 | 0.2020 | 0.2860 | 0.3120 | 1.0576 | 15 | 400 | 43.7 |
| 71 | 0.0650 | 0.6100 | 0.5000 | 0.3740 | 0.7699 | 15 | 350 | 44.2 |
| 72 | 0.1300 | 0.1700 | 0.4350 | 0.2650 | 0.7699 | 10 | 360 | 72.7 |
| 73 | 0.1500 | 0.1000 | 0.3000 | 0.4500 | 1.2222 | 5 | 310 | 19.2 |
| 74 | 0.0780 | 0.0700 | 0.4220 | 0.4300 | 1.0000 | 35 | 380 | 21.5 |
| 75 | 0.1166 | 0.1100 | 0.4268 | 0.3466 | 0.8403 | 85 | 350 | 28.9 |
| 76 | 0.1098 | 0.0920 | 0.3902 | 0.4080 | 1.0000 | 95 | 470 | 19.3 |
| 77 | 0.0790 | 0.0700 | 0.4700 | 0.3810 | 0.8215 | 15 | 340 | 38.7 |
| 78 | 0.0881 | 0.0750 | 0.4119 | 0.4250 | 1.0000 | 35 | 320 | 26.6 |
| 79 | 0.1072 | 0.1162 | 0.4376 | 0.3390 | 0.8355 | 65 | 370 | 15.3 |

TABLE 5-continued

| | Mole Ratio | | | | | Mean elevating rate in 1000–1400° C. (° C./hr) | Mean elevating rate in not less than 1400° C. (° C./hr) | Firing time in 1500–1700° C. (hr) |
|---|---|---|---|---|---|---|---|---|
| No. | R.E.E.O.[1] a | A/2O3 b | CaO + SrO c | TiO2 d | (b + d)/(a + c) | | | |
| 80 | 0.0884 | 0.0990 | 0.4592 | 0.3534 | 0.8262 | 55 | 350 | 20.3 |
| 81 | 0.2357 | 0.2000 | 0.3266 | 0.2377 | 0.7784 | 35 | 350 | 27.3 |
| 82 | 0.0500 | 0.0800 | 0.4290 | 0.4410 | 1.0877 | 35 | 310 | 26.2 |
| 83 | 0.1067 | 0.2000 | 0.3333 | 0.3600 | 1.2727 | 35 | 300 | 26.3 |
| 84 | 0.1228 | 0.1116 | 0.5088 | 0.2568 | 0.5833 | 35 | 400 | 21.4 |
| 85 | 0.1460 | 0.2000 | 0.2700 | 0.3840 | 1.4038 | 35 | 450 | 24.6 |
| 86 | 0.0790 | 0.0750 | 0.3710 | 0.4750 | 1.2222 | 35 | 500 | 19.4 |
| 87 | 0.2000 | 0.2150 | 0.3700 | 0.2150 | 0.7544 | 35 | 350 | 18.3 |
| *88 | 0.0941 | 0.0600 | 0.4587 | 0.3872 | 0.8090 | 250 | 400 | 19.7 |
| *89 | 0.0900 | 0.0660 | 0.4600 | 0.3840 | 0.8182 | 450 | 450 | 17.2 |
| *90 | 0.1540 | 0.1000 | 0.3770 | 0.3690 | 0.8832 | 750 | 330 | 21.2 |
| *91 | 0.1000 | 0.1100 | 0.4300 | 0.3600 | 0.8888 | 2 | 310 | 160.0 |
| *92 | 0.1400 | 0.1400 | 0.4300 | 0.2900 | 0.7544 | 35 | 470 | 8.3 |
| *93 | 0.1400 | 0.1350 | 0.4300 | 0.2950 | 0.7544 | 10 | 3 | 58.2 |
| *94 | 0.1320 | 0.1700 | 0.3270 | 0.3710 | 1.1788 | 45 | 700 | 16.8 |

Mark "*" indicates Sample not falling within the scope of the invention.
[1]R.E.E.O. means rare earth element oxide.

TABLE 6

| | Mean Particle Diameter of Each Crystal Phase (μm) | | Dielectid Constant | | |
|---|---|---|---|---|---|
| No. | Y1[1] | Y2[2] | εr | Q | τf (ppm/° C.) |
| 57 | 6.5 | 25.2 | 42 | 42000 | 28 |
| 58 | 9.1 | 24.2 | 35 | 50000 | −29 |
| 59 | 3.5 | 77.2 | 44 | 43000 | 15 |
| 60 | 9.3 | 19.2 | 39 | 38000 | −14 |
| 61 | 11.0 | 46.3 | 32 | 49000 | −21 |
| 62 | 11.8 | 12.9 | 34 | 39000 | −21 |
| 63 | 3.7 | 14.0 | 42 | 52000 | −15 |
| 64 | 11.0 | 99.5 | 41 | 47000 | 0 |
| 65 | 5.8 | 10.0 | 43 | 46000 | 25 |
| 66 | 5.1 | 24.7 | 35 | 44000 | −2 |
| 67 | 11.3 | 16.5 | 32 | 41000 | −30 |
| 68 | 3.2 | 18.8 | 41 | 44000 | −13 |
| 69 | 6.4 | 10.3 | 31 | 35000 | −18 |
| 70 | 6.8 | 15.3 | 33 | 57000 | −26 |
| 71 | 7.4 | 24.2 | 36 | 59000 | 30 |
| 72 | 9.5 | 24.6 | 32 | 45000 | −29 |
| 73 | 11.9 | 44.5 | 38 | 39000 | −14 |
| 74 | 5.7 | 17.2 | 47 | 51000 | 26 |
| 75 | 10.2 | 36.3 | 36 | 52000 | 5 |
| 76 | 5.3 | 28.0 | 41 | 58000 | −20 |
| 77 | 11.4 | 50.1 | 40 | 48000 | 25 |
| 78 | 6.3 | 19.4 | 45 | 49000 | 0 |
| 79 | 3.3 | 14.6 | 40 | 55000 | −9 |
| 80 | 6.2 | 21.4 | 42 | 51000 | 7 |
| 81 | 6.4 | 17.2 | 30 | 35000 | −30 |
| 82 | 7.8 | 14.2 | 31 | 35000 | 30 |
| 83 | 11.0 | 21.4 | 31 | 37000 | −25 |
| 84 | 5.7 | 17.2 | 32 | 40000 | 14 |
| 85 | 7.3 | 20.1 | 39 | 37000 | 10 |
| 86 | 7.4 | 13.0 | 32 | 35000 | −5 |
| 87 | 13.6 | 15.0 | 36 | 35000 | −20 |
| *88 | 14.6 | 10.8 | 36 | 8000 | 16 |
| *89 | 7.5 | 6.3 | 38 | 8000 | 38 |
| *90 | 6.3 | 4.7 | 33 | 5000 | −19 |
| *91 | 20.1 | 13.6 | 36 | 5000 | −24 |
| *92 | 8.0 | 5.7 | 32 | 18000 | −19 |
| *93 | 25.0 | 16.0 | 29 | 12000 | −22 |
| *94 | 10.0 | 7.2 | 27 | 10000 | −23 |

Mark "*" indicates Sample not falling within the scope of the invention.
[1]"Y1" means a crystal phase of which main phase is a clystal phase composed of an oxide of a rare earth element and Al.
[2]"Y2" means a crystal phase of which main phase is a clystal phase composed of an oxide of M (M is Ca and/or Sr) and Ti.

It should be noted that the present invention is not to be limited to the foregoing examples and numerous modifications and variations can be devised without departing from the scope of the invention.

What is claimed is:

1. A dielectric ceramics comprising an oxide containing, as a metal element, at least a rare earth element (Ln), Al, M (M is Ca and/or Sr) and Ti; and at least part of the oxide of Al being present as a crystal phase of $\beta$-$Al_2O_3$ and/or $\theta$-$Al_2O_3$.

2. The dielectric ceramics according to claim 1 wherein in the crystals comprising the oxide containing a rare earth element (Ln), Al, M (M is Ca and/or Sr) and Ti, the crystal of which crystal system is hexagonal and/or orthorhombic is present not less than 80% by volume.

3. The dielectric ceramics according to claim 1 wherein, as a metal element, at least one of Mn, W and Ta is contained in an amount of 0.01 to 3% by weight in total, as $MnO_2$, $WO_3$ and $Ta_2O_5$, respectively.

4. The dielectric ceramics according to claim 1 wherein the crystal phase of $\beta$-$Al_2O_3$ and/or $\theta$-$Al_2O_3$ is contained in an amount of 1/100000 to 3% by volume.

5. The dielectric ceramics according to claim 1 wherein, as a metal element, at least a rare earth element (Ln), Al, M (M is Ca and/or Sr) and Ti are contained, and when its composition formula is expressed as follows:

$$aLn_2O_x \ bAl_2O_3 \ cMO \ dTiO_2 \ (\text{where } 3 \leq x \leq 4),$$

a, b, c and d satisfy the followings:
$0.056 \leq a \leq 0.214$
$0.056 \leq b \leq 0.214$
$0.286 \leq c \leq 0.500$
$0.230 \leq d \leq 0.470$
a+b+c+d=1.

6. A dielectric resonator comprising a dielectric ceramics according to claim 1 which is disposed between a pair of input/output terminals, so as to be operated by electromagnetic coupling.

7. A dielectric ceramics containing, as a metal element, at least a rare earth element (Ln), Al, M (M is Ca and/or Sr) and Ti, which comprises an average particle diameter $D_1$ of the crystal of which main phase is a crystal phase composed of an oxide of M and Ti is larger than an average particle diameter $D_2$ of the crystal of which main phase is a crystal phase composed of an oxide of a rare earth element (Ln) and Al.

8. The dielectric ceramics according to claim 7 wherein the average particle diameter $D_1$ of the crystal of which main phase is a crystal phase composed of an oxide of M and Ti is $12 \mu m \leq D_1 \leq 100 \mu m$, and the average particle diameter $D_2$ of the crystal of which main phase is a crystal phase composed of an oxide of a rare earth element (Ln) and Al is $3 \mu m \leq D_2 \leq 12 \mu m$.

9. The dielectric ceramics according to claim 8 wherein the average particle diameter $D_1$ of the crystal of which main phase is a crystal phase composed of an oxide of M and Ti is $15 \mu m \leq D_1 \leq 60 \mu m$, and the average particle diameter $D_2$ of the crystal of which main phase is a crystal phase composed of an oxide of a rare earth element (Ln) and Al is $5 \mu m \leq D_2 \leq 10 \mu m$.

10. The dielectric ceramics according to claim 7 wherein, when its composition formula is expressed as follows:

$$aLn_2O_x\ bAl_2O_3\ cMO\ dTiO_2\ (\text{where } 3 \leq x \leq 4),$$

a, b, c and d satisfy the followings:

$0.056 \leq a \leq 0.214$ $0.056 \leq b \leq 0.214$ $0.286 \leq c \leq 0.500$ $0.230 < d < 0.470$ $a+b+c+d=1$.

11. A dielectric resonator comprising a dielectric ceramic according to claim 7 which is disposed between a pair of input/output terminals, so as to be operated by electromagnetic coupling.

* * * * *